US012656441B2

(12) United States Patent

Jeon

(10) Patent No.: US 12,656,441 B2

(45) Date of Patent: Jun. 16, 2026

(54) SENSING BLOCK INSPECTION DEVICE THERMALLY FUSED AND LASER-WELDED TO BE MOUNTED ON BATTERY MODULE

(71) Applicant: GIL ENGINEERING CO., LTD., Ulsan (KR)

(72) Inventor: Byung Gil Jeon, Ulsan (KR)

(73) Assignee: GIL ENGINEERING CO., LTD., Ulsan (KR)

( * ) Notice: Subject to any disclaimer, the term of this patent is extended or adjusted under 35 U.S.C. 154(b) by 105 days.

(21) Appl. No.: 18/674,925

(22) Filed: May 27, 2024

(65) Prior Publication Data

US 2024/0410968 A1 Dec. 12, 2024

(30) Foreign Application Priority Data

Jun. 12, 2023 (KR) ........................ 10-2023-0075022

(51) Int. Cl.
| | |
|---|---|
| *G01R 35/00* | (2006.01) |
| *G01R 3/00* | (2006.01) |
| *G01R 31/36* | (2020.01) |
| *H01M 10/48* | (2006.01) |

(52) U.S. Cl.
CPC ............... *G01R 35/00* (2013.01); *G01R 3/00* (2013.01); *G01R 31/3644* (2013.01); *H01M 10/48* (2013.01)

(58) Field of Classification Search
CPC ...... G01R 35/00; G01R 3/00; G01R 31/3644; H01M 10/48
See application file for complete search history.

(56) References Cited

U.S. PATENT DOCUMENTS

2013/0075371 A1* 3/2013 De Souza ............ B23K 31/125
219/109

FOREIGN PATENT DOCUMENTS

| | | | | |
|---|---|---|---|---|
| EP | 0878264 A1 * | 11/1998 | ........... | B23K 11/256 |
| KR | 10-1340278 B1 | 12/2013 | | |
| KR | 10-2014-0125958 A | 10/2014 | | |
| KR | 10-2018-0056959 A | 5/2018 | | |
| KR | 10-2354563 B1 | 1/2022 | | |
| KR | 10-2022-0050379 A | 4/2022 | | |
| KR | 10-2439345 B1 | 9/2022 | | |
| KR | 10-2022-0148006 A | 11/2022 | | |

(Continued)

*Primary Examiner* — Paresh Patel

(74) *Attorney, Agent, or Firm* — NKL LAW; Jae Youn Kim

(57) ABSTRACT

Disclosed is a sensing block inspection device thermally fused and laser-welded to be mounted on a battery module to dispose a sensing block including a front and a near so that various inspections are performed through rotation, the sensing block inspection device including: a turntable for rotating a jig member mounted with a sensing block; an insulation resistance inspection unit for performing an insulation resistance inspection on the sensing block; a heat-fusion unit for heat-fusing the sensing block; a laser-welding unit for laser-welding the sensing block; an energization inspection unit for performing an energization inspection on the sensing block; a vision inspection unit for transmitting image information to a control unit; and a barcode adhesive unit for adhering a barcode printing paper to the sensing block, wherein the control unit controls the turntable to allow the jig member to sequentially move to the above components.

18 Claims, 29 Drawing Sheets

(56)        References Cited

FOREIGN PATENT DOCUMENTS

KR      10-2022-0153372  A      11/2022
KR      10-2023-0009134  A       1/2023

* cited by examiner (a)

(b)

SENSING BLOCK INSPECTION DEVICE THERMALLY FUSED AND LASER-WELDED TO BE MOUNTED ON BATTERY MODULE

BACKGROUND OF THE INVENTION

1. Field of the Invention

The present technology relates to a sensing block inspection device thermally fused and laser-welded to be mounted on a battery module to dispose a sensing block composed of a front and a near on a rotatable workbench, so that various inspections are performed through rotation of the workbench.

2. Description of the Related Art

In general, secondary batteries refer to batteries that can be charged and discharged, unlike primary batteries that cannot be recharged, and are widely used in electronic devices such as mobile phones, laptops, computers and camcorders, and electric vehicles.

In particular, since lithium secondary batteries used in electric vehicle batteries have an operating voltage of about 3.5 V to 3.6 V, have a capacity larger than nickel-cadmium batteries or nickel-hydrogen batteries commonly used as power sources for electronic equipment, and have a high energy density per unit weight, the degree of utilization tends to rapidly increase.

The electric vehicle battery has an electrode assembly including an anode, a cathode, and a separator formed between the anode and the cathode to insulate the anode and the cathode, and is formed by performing a formation process and an aging process. Since defects often occur due to various reasons during the processes, it is important to accurately screen the defects, and electrical assembly is performed by a sensing block composed of multiple fronts and nears.

Recently, a scheme of screening a low-voltage defect in a corresponding electric vehicle battery during an activation process has been used to screen defects in electric vehicle batteries. As part of the scheme, an inspection process has been performed on a sensing block before being assembled into the electric vehicle battery. The inspection process on the sensing block includes insulation resistance inspection, energization inspection, and vision inspection.

However, a process time required for the above-described inspection on sensing blocks may be increased since the inspection process proceeds while an operator moves the objects (sensing blocks) to each processing device, and this may expand into a problem that exerts a significant impact on mass production of the sensing blocks.

DOCUMENTS OF RELATED ART

Korean Unexamined Patent Publication No. 10-2023-9134 (Published on Jan. 17, 2023)

Korean Unexamined Patent Publication No. 10-2022-50379 (Published on Apr. 25, 2022)

Korean Unexamined Patent Publication No. 10-2022-148006 (Published on Nov. 4, 2022)

Korean Patent Registration No. 10-2354563 (Published on Jan. 25, 2022)

SUMMARY OF THE INVENTION

In order to solve the above-mentioned conventional problems, the present invention provides an inspection device capable of determining whether an error occurs by executing multiple inspections on a sensing block, which is composed of fronts and nears and serves as an inspection object, on a single workbench, so that time required for inspection may be shortened and mass production may be facilitated.

In order to solve the above-mentioned conventional problems, provided is a sensing block inspection device thermally fused and laser-welded to be mounted on a battery module according to the present invention. An inspection device for inspecting a sensing block (10) mounted on an electric vehicle battery module through a control signal from a control unit includes: a turntable (100) for rotating a jig member (110) mounted thereon with a sensing block (10) including a front (11) and a near (13); an insulation resistance inspection unit (200) for performing an insulation resistance inspection on the sensing block (10) mounted on the jig member (110); a heat-fusion unit (300) for heat-fusing the sensing block (10) mounted on the jig member (110); a laser-welding unit (400) for laser-welding the sensing block (10) mounted on the jig member (110); an energization inspection unit (500) for performing an energization inspection on the sensing block (10) mounted on the jig member (110); a vision inspection unit (600) for transmitting image information, which is obtained by photographing the sensing block (10) mounted on the jig member (110) and heat-fused by the heat fusing unit (300) and the sensing block (10) mounted on the jig member (110) and welded by the laser-welding unit (400), to a control unit; and a barcode adhesive unit (700) for allowing a barcode printing paper (721) to adhere to the sensing block (10) mounted on the jig member (110), the control unit controls the turntable (100) to allow the jig member (110) to sequentially move to the insulation resistance inspection unit (200), the heat-fusion unit (300), the laser-welding unit (400), the energization inspection unit (500), the vision inspection unit (600), and the barcode adhesive unit (700).

In addition, the turntable (100) may include: a rotation base (120) provided at an upper central part thereof with a rotation motor (40), and a disc-shaped rotation plate (121) rotatably coupled to the rotation motor (40) and having a top surface on which at least one jig member (110) is mounted, wherein the insulation resistance inspection unit (200), the heat-fusion unit (300), the laser-welding unit (400), the energization inspection unit (500), the vision inspection unit (600) and the barcode adhesive unit (700) may be sequentially arranged around the rotation plate (121).

In addition, the jig member (110) may include an installation plate (111) detachably coupled to the rotation plate (121), and a plurality of protrusions (113) protruding from an upper part of the installation plate (111) and individually mounted thereon with the fronts (11) and the nears (13), wherein the protrusion (113) may include an insertion pin (115) inserted into a groove formed on a lower surface of the front (11) or the near (13), and through-holes (117) through which a plurality of detection pins (123) raised and lowered to detect a presence or absence of the front (11) and the near (13) inserted into the protrusions (113) in which the through-holes may be perforated to be connected to the installation plate (111).

In addition, the insulation resistance inspection unit (200) may include an insulation inspection base (210) installed to have a predetermined height and provided at a lower part thereof with a first lifting plate (211) raised and lowered by a cylinder (20), a sensing member (220) installed at a lower part of the first lifting plate (211) and upwardly protruding over the first lifting plate (211) upon contact with the sensing block (10) to perform an electrical short-circuit, and a first probe pin (230) mounted at a lower part of the first lifting plate (211) to come into contacts with the sensing block (10) through an elastic force to inspect an insulation resistance of the sensing block (10), wherein the first probe pin (230) may be controlled to apply an electric signal to the sensing block (10) only when the sensing block (10) is present through the sensing member (220), and the sensing member (220) and the first probe pin (230) may be installed on the first lifting plate (211) to correspond to the number of the fronts (11) and the nears (13).

In addition, the sensing member (220) may include a contact terminal (221) provided at an upper part of the first lifting plate (211) so as to be electrically connected to the control unit, and an elastic terminal (223) inserted through the first lifting plate (211) and raised to be electrically connected to the contact terminal (221) through an elastic force after contact with the sensing block (10) when the first lifting plate (211) is lowered.

In addition, the heat-fusion unit (300) may include a fusion base (310) having a predetermined height and provided with a cylinder (20) and an air tank (313) for raising and lowering the second lifting plate (311), a plurality of fusion tips (320) mounted on a lower part of the second lifting plate (311) and generating heat by an applied power source to fuse printed circuit boards (PCB) provided in the front (11) and the near (13), a first cooling pipe (330) mounted on the lower part of the second lifting plate (311) so as to be pipe-connected to the air tank (313) to discharge air to cool the fused PCBs, and a stripper (340) mounted on the lower part of the second lifting plate (311) to press and fix the fused and cooled sensing block (10) through an elastic force.

In addition, the inspection device (1) further includes a fall prevention tool (350), and the fall prevention tool (350) may include a first fixing plate 351 formed therein with a first opening hole (353), a second fixing plate (355) formed therein with a second opening hole (357), and a fixing cylinder (359) having a rod inserted through the first opening hole (353) and the second opening hole (357) disposed to face each other.

In addition, the laser-welding unit (400) may include a welding base (410) having a predetermined height and provided with cylinders (20) having rods extending and contracting in X-axis, Y-axis, and Z-axis directions, respectively, a laser welder (420) installed on the welding base (410) so as to be connected to at least two of the cylinders (20) and movable in the X-axis and Y-axis directions, a third lifting plate (430) positioned below the laser welder (420) and connected to the cylinder (20) having the rod expanding and contracting in the X-axis direction so as to be mounted to the welding base (410) and movable up and down, in which the third lifting plate is formed therein with a plurality of welding holes (431) through which a laser for welding passes, a plurality of first pressing bodies (440) installed on a lower part of the third lifting plate (430) to press and fix terminals (15) formed on the front (11) and the near (13) through an elastic force, and a second cooling pipe (450) for discharging air to cool the welded terminals (15).

In addition, the laser-welding unit (400) may further include a measuring device (460) installed on the welding base (410) to measure intensity of the laser radiated from the laser welder (420).

In addition, the energization inspection unit (500) may include an energization base (510) provided with a pair of cylinders (20) having a predetermined height, and installed therein with a pair of fourth lifting plates (511) coupled to the cylinders (20), respectively, to be raised and lowered, a second probe pin (530) installed on a lower surface of the fourth lifting plate (511) to elastically come into contact with the sensing block (10), thereby applying an electric signal, a terminal coupling member (520) installed on the lower surface of the fourth lifting plate (511) and electrically connected to a terminal pin formed on the sensing block (10), and a second pressing body (513) installed on the lower surface of the fourth lifting plate (511) to press and fix the sensing block (10), wherein the terminal coupling member (520) may include a first insertion terminal (521) inserted into a terminal pin having an open top, and a second insertion terminal (523) inserted into a terminal pin having an open side.

In addition, the second insertion terminal (523) may be configured to reciprocate in a horizontal direction by the cylinder (20) so as to be inserted into or separated from the terminal pin having the open side.

In addition, the vision inspection unit (600) may include a vision base (610) equipped with a motor for rotating a screw (611) and installed therein with a moving plate (613) screw-coupled by the screw (611) to move in the X-axis direction along a rail, a pair of vision cameras (620) mounted on a lower part of a moving bracket (615) installed on the moving plate (613), and a transceiver unit (630) installed on the vision base (610) to transmit image information obtained by the vision cameras (620) to the control unit.

In addition, the vision cameras (620) may photograph a portion fused to the PCB board and a welding line (L) welded to the terminal (15), in which a plurality of welding lines (L) may be formed on the terminal (15) to have an interval of 3 mm to 4 mm.

In addition, a pair of barcode adhesive units (700) may be installed on the turntable (100), in which one of the barcode adhesive units (700) may allow a barcode printing paper (721) to adhere to an outer surface of the front (11), and the other one of the barcode adhesive units (700) may be controlled to allow a barcode printing paper (721) to adhere to a surface of the near (13).

In addition, the barcode adhesive unit (700) may include a barcode base (710) installed therein with a plurality of cylinders (20) having rods expanding and contracting in the X-axis, Y-axis, and Z-axis directions, a barcode printer (720) installed on the barcode base (710) to discharge tearable barcode printing papers (721) on which a barcode is printed, an adhesive member (730) for adsorbing the discharged barcode printing paper (721) and adhering the adsorbed barcode printing paper to the sensing block (10), and a rotation member (740) installed on the barcode base (710) to rotate the adhesive member (730).

In addition, the adhesive member (730) may include an adhesive bracket (731) rotatably coupled to the rotation member (740), a plurality of adsorption bars (733) provided on the adhesive bracket (731) to adsorb the discharged barcode printing papers (721), respectively, and a third pressing body (739) provided on the adhesive bracket 731 to press the barcode printing paper (721) by an elastic force after the adsorption bar (733) adheres the barcode printing paper (721) to the sensing block (10).

In addition, the rotation member (740) may include a lifting cylinder (741), and a link (743) having one side rotatably coupled to the lifting cylinder (741) and the other side coupled to the adhesive bracket (731) to shift a vertical movement of the lifting cylinder (741) to a rotational movement for rotating the adhesive bracket (731).

In addition, the adsorption bar (733) may include a first adsorption bar (735) provided on the adhesive bracket (731)

to have a fixed length, and a pair of adsorption bars (737) installed on the adhesive bracket (731), adjacent to the first adsorption bar (735) and having variable lengths through the cylinders (20).

According to the present invention, unlike the related art, a plurality of sensing blocks mounted on the jig member can be rotated by rotation of the rotation plate step by step, and the insulation resistance, heat-fusion, laser-welding, energization inspection, vision inspection, and barcode adhesion can be quickly performed for the corresponding sensing blocks according to the rotation direction around the rotation plate even in a narrow space, so that time for the inspection can be shortened and mass production of the sensing blocks can be facilitated.

DETAILED DESCRIPTION OF THE INVENTION

Figure 1:
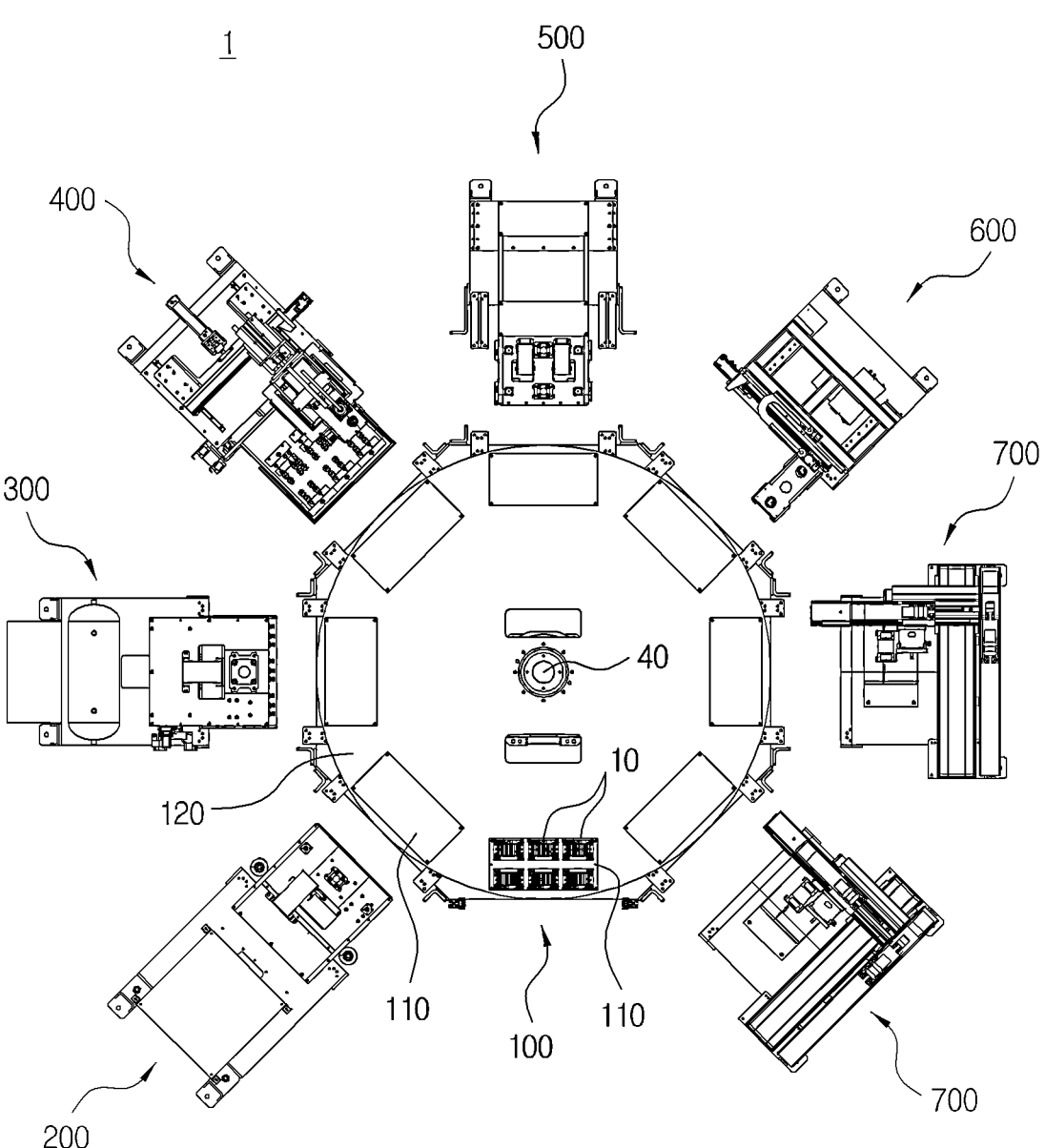
FIG. 1 is a plan view showing a sensing block inspection device thermally fused and laser-welded to be mounted on a battery module according to the present invention.

Hereinafter, various embodiments will be described in more detail with reference to the accompanying drawings. The embodiments described in the present specification may be variously modified. Specific embodiments will be illustrated in the drawings and described in the detailed description in detail. However, the specific embodiments disclosed in the accompanying drawings are merely intended to provide the further understanding of various embodiments. Therefore, it will be understood that the specific embodiments disclosed in the accompanying drawings do not limit the technical idea and may include all equivalents or substitutes included in the spirit and technical scope of the present invention.

The terms including an ordinal number such as first and second may be used to describe various components, however, these components are not limited by the above-mentioned terms. The above terms are used only for the purpose of distinguishing one component from another component.

In the present specification, it will be understood that the term such as "include" or "have" is intended to designate the presence of a feature, number, step, component, part or a combination thereof recited in the specification, and does not preclude the possibility of the presence or addition of one or more other features, numbers, steps, components, parts or combinations thereof. When one component is recited to be "connected" or "linked" to other component, it will be understood that the one component may be directly connected to or linked to the other component, but another component may be present therebetween. On the other hand, when it is mentioned that one component is "directly connected" or "directly linked" to other component, it will be understood that another component is not present therebetween.

Further, in the following description of the embodiments of the present invention, the detailed description of the related known function or configuration incorporated herein will be shortened or omitted when it possibly makes the subject matter of the present invention unclear unnecessarily.

Hereinafter, a sensing block inspection device thermally fused and laser-welded to be mounted on a battery module according to the present invention (hereinafter simply referred to as 'inspection device') will be described in detail with reference to the accompanying drawings.

Prior to the description, the control unit in the present invention is configured to enable an administrator to manually or remotely control each component described later, and has the form of a control panel including multiple switches and displays although it is not shown. Detailed description will be omitted so as not to obscure the idea of the present invention.

In addition, it will be noted that each of the components described below is indicated as being moved and lifted in X-axis, Y-axis, and Z-axis directions by cylinders, however, the present invention is not limited thereto, and any moving means including a servo motor is possible, as needed.

First, as shown in FIG. 1, an inspection device 1 according to the present invention mainly includes a turntable 100, an insulation resistance inspection unit 200, a heat-fusion unit 300, a laser-welding unit 400, an energization inspection unit 500, a vision inspection unit 600, and a barcode adhesive unit 700, and the above components are controlled manually or remotely by the control unit.

More particularly, the turntable 100 is sequentially installed therein with other components described later, rotatably provided with a sensing block 10 composed of a front 11 and a near 13 to enable not only insulation resistance inspection, but also heat-fusion, welding, energization inspection, vision inspection, and barcode adhesion, and includes a jig member 110 and a rotation base 120.

Figure 2:
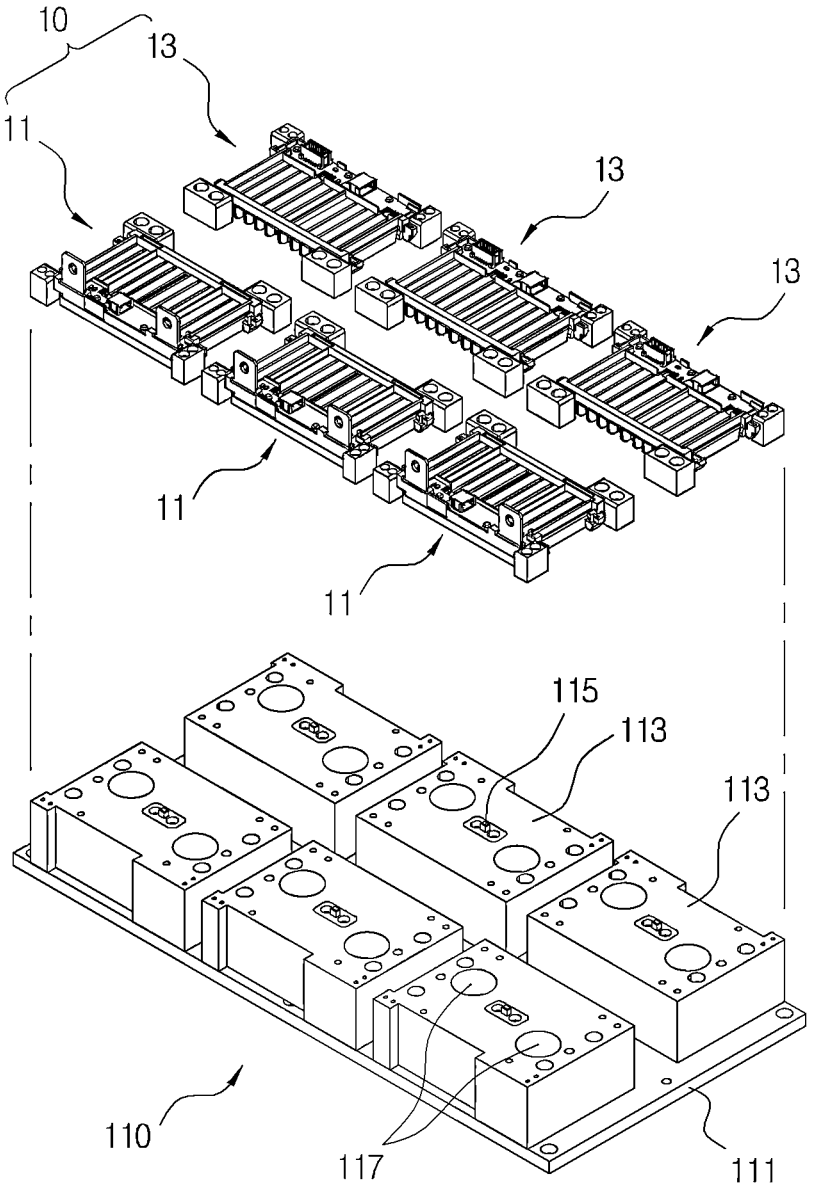
FIG. 2 is a perspective view showing sensing blocks mounted on a jig member of FIG. 1.

For example, as shown in FIG. 2, the jig member 110 includes an installation plate 111 and a protrusion 113 that are configured to allow the sensing blocks 10 for inspection to be sequentially positioned for each of the components (the insulation resistance inspection unit and the others) through rotation of the rotation base 120.

As shown in the drawings, a plurality of installation plate 111 may have lower surfaces detachably mounted on an upper surface of the rotation plate 121, and may be formed on an upper surface thereof with protrusions 113 on which three fronts 11 and nears 13 are detachably mounted in parallel.

An insertion pin 115 protruding upward may be formed on the protrusion 113, and the insertion pins 115 may be inserted into grooves formed on lower surfaces of the fronts 11 and the nears 13 so as to be mounted on the protrusions 113 to correspond to sensing blocks 10 having different shapes.

In other words, positions for forming the grooves into which the insertion pins 115 are inserted on the lower surfaces of the fronts 11 and the nears 13 may be varied according to types of the sensing blocks 10, so that the sensing block 10, which an operator wants to inspect, may be easily mounted on the jig member 110.

In addition, through-holes 117 for communicating with the rotation plate 121 may be formed on an outer surface of the jig member 110, in which a detection pin 123 constituting the rotation base 120 may pass through the through-hole 117 to allow the control unit to determine whether the sensing block 10 mounted on the jig member 110 is present through an electric signal.

Figure 3:
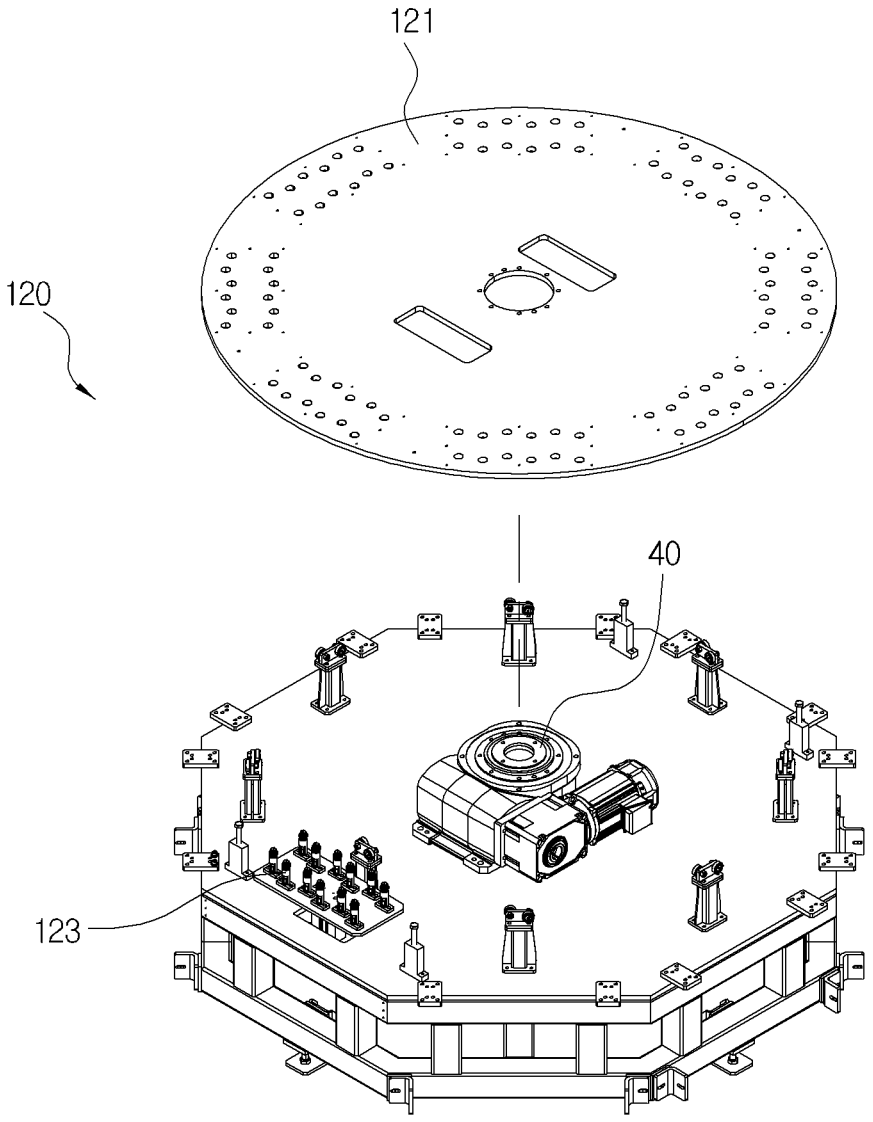
FIG. 3 is an exploded perspective view showing a rotation base of FIG. 1.
Figure 4:
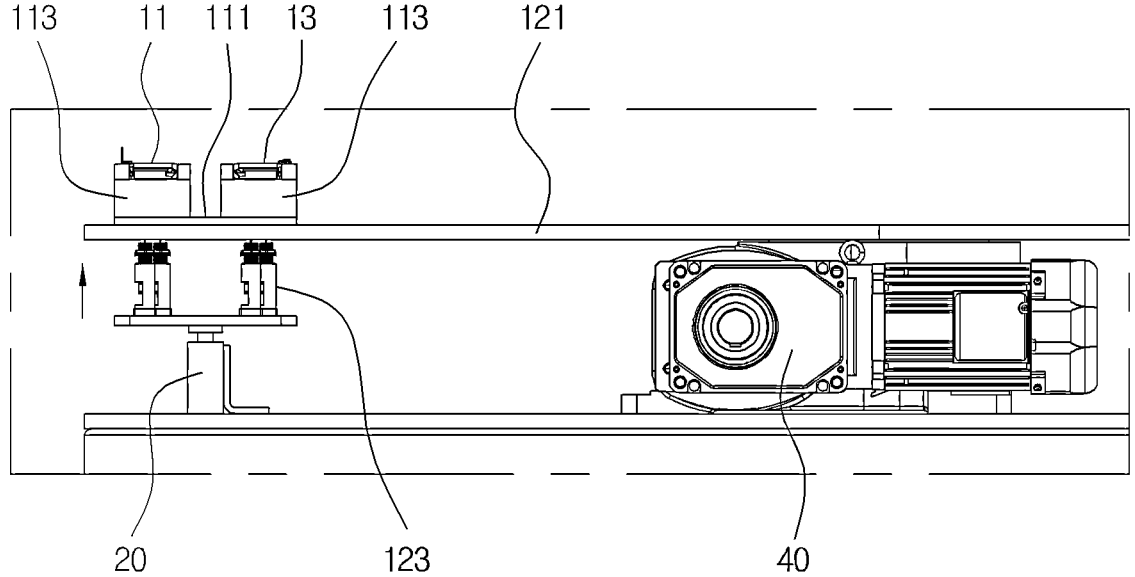
FIG. 4 is an enlarged view showing a detection pin portion of FIG. 3.
Figure 5:
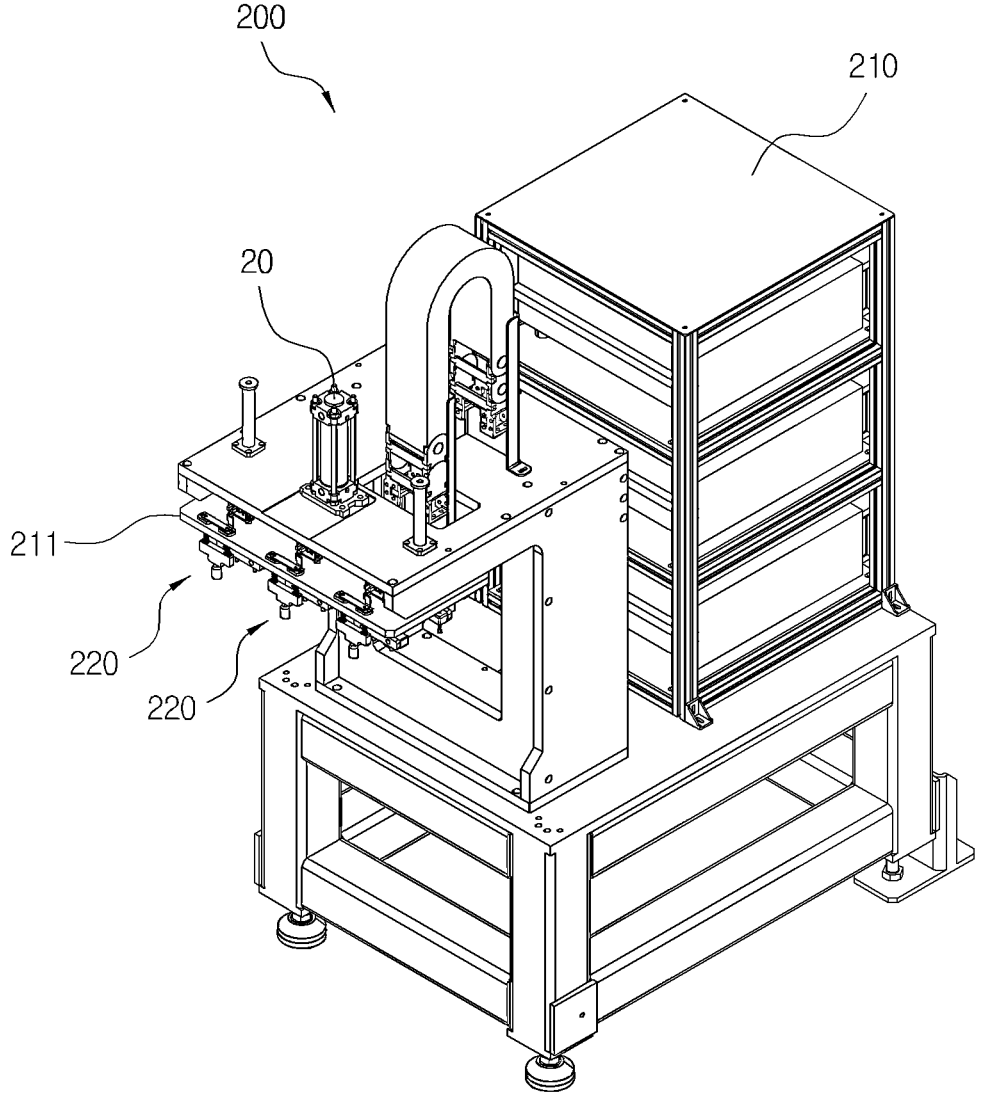
FIG. 5 is a perspective view showing an insulation resistance inspection unit of FIG. 1.
Figure 6:
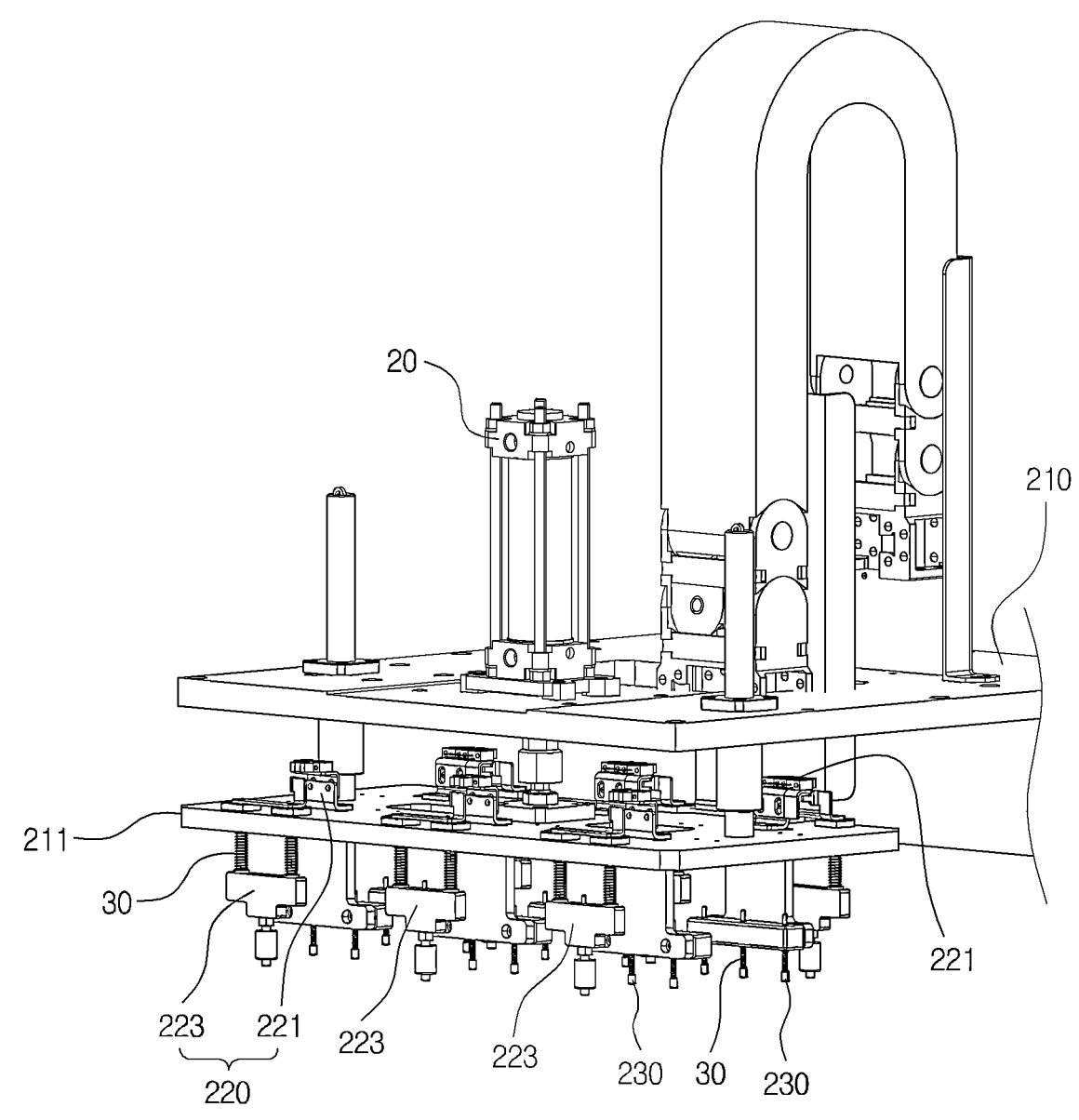
FIG. 6 is a partially enlarged perspective view of a sensing member of FIG. 5.
Figure 7:
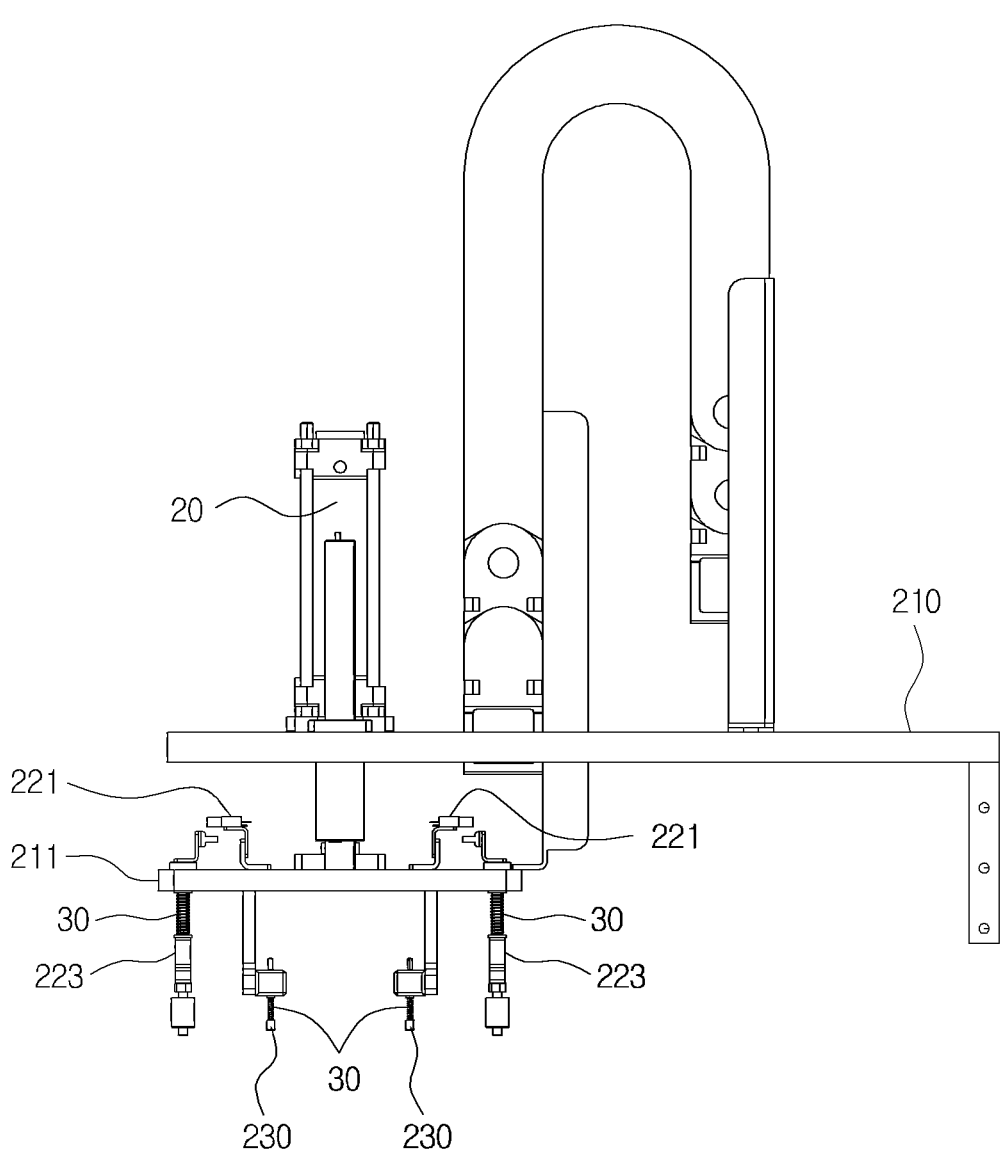
FIG. 7 is a side view of FIG. 6.
Figure 8:
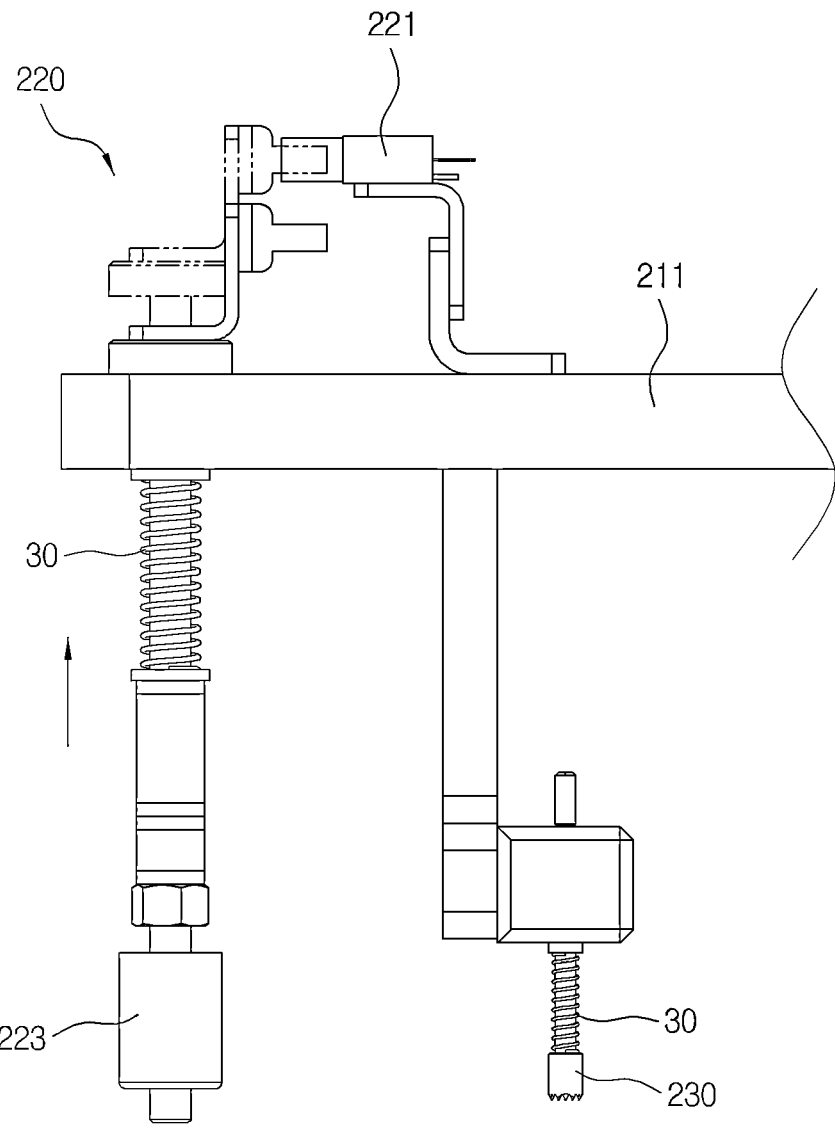
FIG. 8 is a view showing the operational relationship of the sensing member of FIG. 7.

In addition, as shown in FIGS. 3 and 4, the rotation base 120 includes a rotation plate 121 and a detection pin 123, which are configured to dispose the sensing blocks 10, such that the jig member 110 mounted thereon with the sensing blocks 10 is rotated and then the inspection and the like are performed through the components described later.

As shown in the drawings, the rotation plate 121 may have a disc shape as a whole, in which a central portion of a diameter thereof may be coupled to a motor 40 to provide a power for rotating the rotation plate 121 step by step.

The rotation base 120 may further include a sensor member for allow the control unit to recognize the operator or the like approaching to the inspection device 1 of the present invention to prevent interference with the rotation of the rotation plate 121, and the control unit may control whether the inspection device 1 operates according to detection information from the sensor member to prevent an accident.

As shown in the drawings, a plurality of detection pins 123 may be provided on the lifting plate to face the above-described through-holes 117 in a vertical direction, and lifted by the cylinder 20 mounted on the rotation base 120 to apply an electric signal, so that the control unit determines a presence of the sensing block 10 mounted on the jig member 110.

In other words, when the control unit detects through the sensor member that the operator has moved away from the rotation plate 121 after mounting the fronts 11 and the nears 13 on the jig member 110, the control unit may operate the cylinder 20 to allow the detection pins 123 to ascend.

Then, the ascending detection pins 123 may pass through the through-holes 117 and come into contact with lower surfaces of the sensing blocks 10 mounted on the jig member 110. When an electric signal is applied to the detection pin 123 through the contact, the control unit may detect the electric signal to determine the presence of the corresponding sensing block 10.

In addition, as shown in FIGS. 5 to 8, the insulation resistance inspection unit 200 may include an insulation inspection base 210, a sensing member 220, and a first a probe pin 230, which are configured to inspect an insulation resistance of the sensing block 10.

For example, as shown in the drawings, the insulation inspection base 210 may be coupled to a plurality of brackets with a predetermined height by using fastening means, such as bolts, to have a lower surface fixed to a floor.

At least one measuring device electrically connected to the control unit may be stored at a rear side of the insulation inspection base 210 to measure the insulation resistance of the sensing block 10, and a first lifting plate 211 installed thereon with the sensing member 220 and the first probe pin 230 to be movable vertically may be provided at a front thereof adjacent to the rotation plate 121 and have a structure that may be raised and lowered by the cylinder 20.

In addition, as shown in the drawings, the sensing member 220 may include a contact terminal 221 and an elastic terminal 223, which are configured to come into contact with the sensing block 10 when lowered by the first lifting plate 211 and then ascend to detect the presence of the corresponding sensing block 10. The sensing member 220 may be installed on the first lifting plate 211 to have the number equal to a total of the fronts 11 and the nears 13 mounted on the jig member 110.

The contact terminal 221 may be fixedly installed on an upper part of the first lifting plate 211 so as to be installed in contact or non-contact with the elastic terminal 223 moving up and down depending on the contact with the sensing block 10.

To this end, as shown in the drawings, the elastic terminal 223 may be installed to have a structure passing and inserted through the first lifting plate 211, and may be provided on an outer surface thereof with an elastic body 30 in the form of a coil spring so as to move up and down through an elastic force of the elastic body 30.

In addition, the first probe pin 230 may be connected to the measuring device through a cable or the like, provide a voltage for measuring the insulation resistance after coming into contact with the sensing block 10, and allow the measuring device to measure an insulation resistance value for the applied voltage and transmit result information to the control unit.

In other words, when the first lifting plate 211 is lowered by the cylinder 20 to measure the insulation resistance value of the sensing block 10, an upper part of the elastic terminal 223 may ascend upward simultaneously when a lower surface of the elastic terminal 223 presses the sensing block 10 and be electrically connected to the contact terminal 221, so that the connection information may be transmitted to the control unit.

The first probe pin 230 may also come into contact with the sensing block 10.

Then, the control unit may recognize that the insulation resistance on the sensing block 10 is prepared to be measured and apply a voltage to the probe pin through the measuring device to measure the insulation resistance value of the sensing block 10, and then the measurement information may be transmitted to the control unit.

When the inspection of the insulation resistance on the sensing block 10 is completed in the above manner, the first lifting plate 211 may ascend to an initial position. In this process, the elastic terminal 223 may be lowered by the elastic force of the elastic body 30 provided in the elastic terminal 223 and maintain an initial state.

Figure 9:
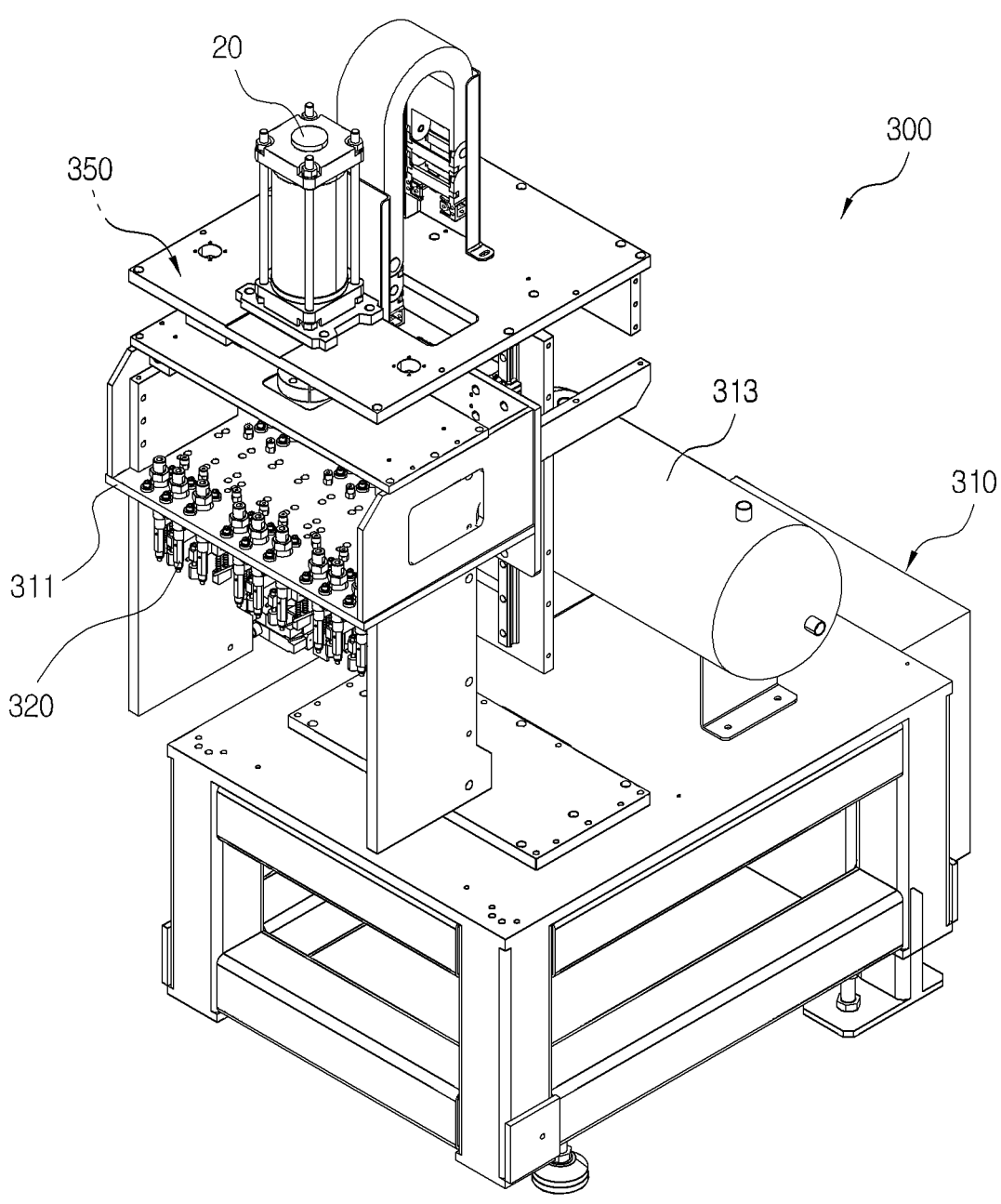
FIG. 9 is a perspective view showing a heat-fusion unit of FIG. 1.
Figure 10:
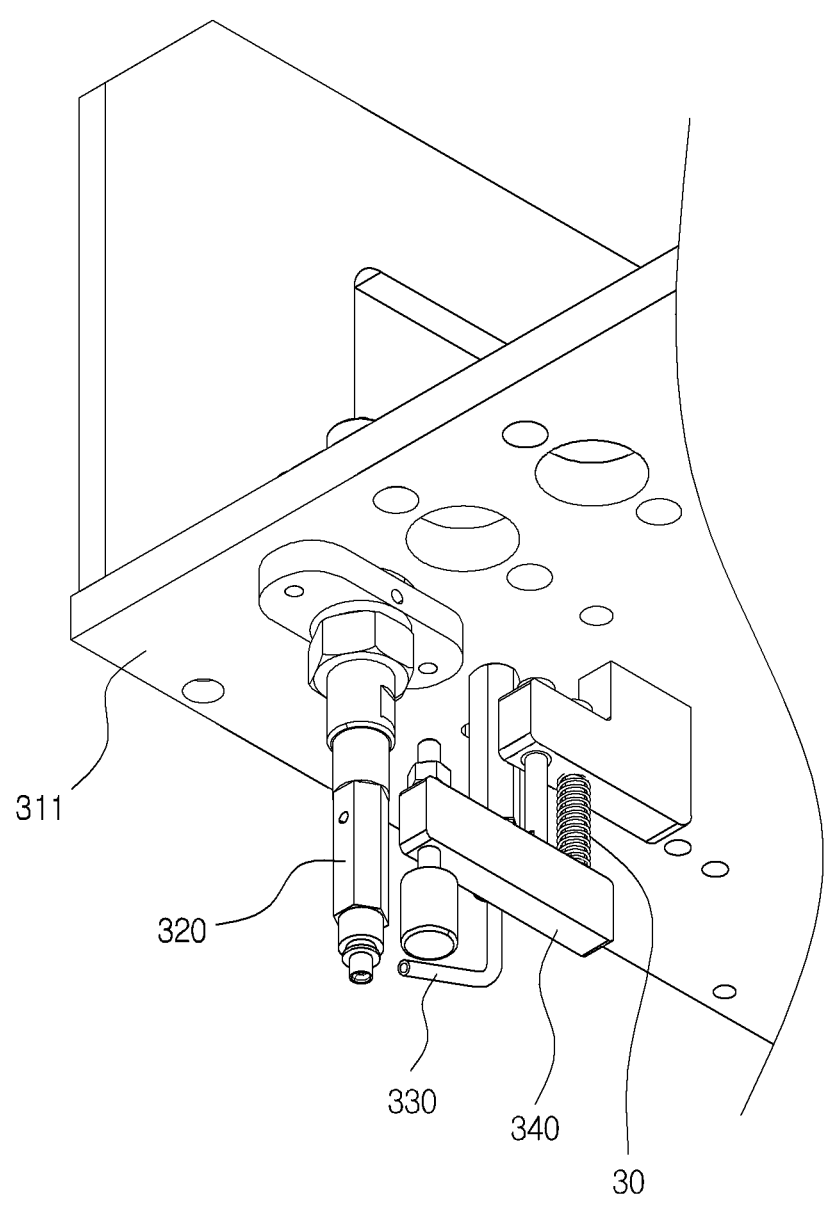
FIG. 10 is an enlarged perspective view showing a fusion tip portion of FIG. 9.
Figure 11:
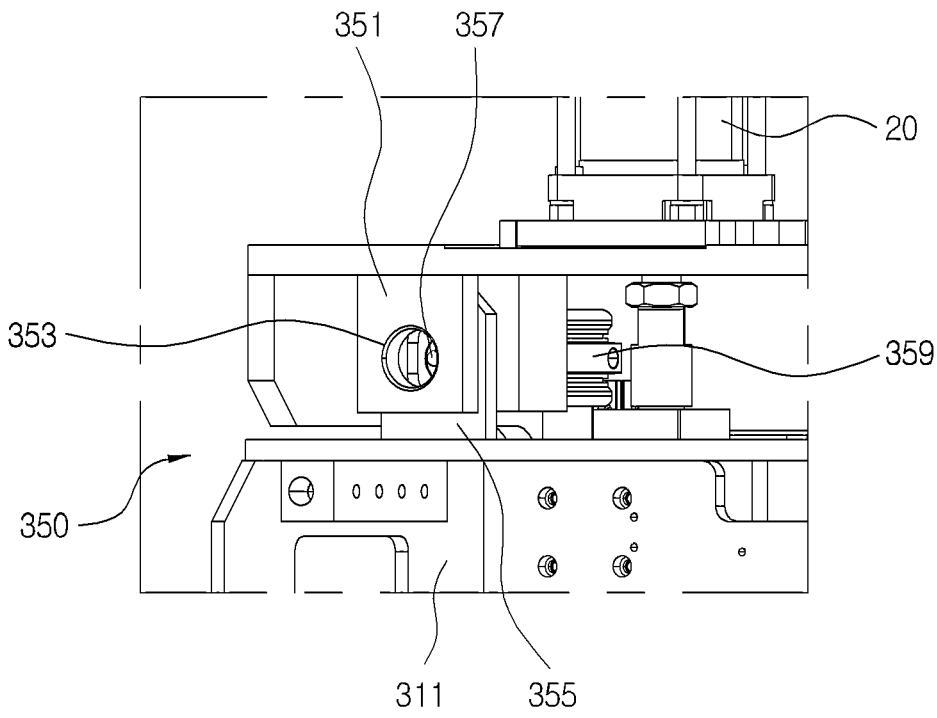
FIG. 11 is an enlarged perspective view showing a fall prevention tool of FIG. 9.
Figure 12:
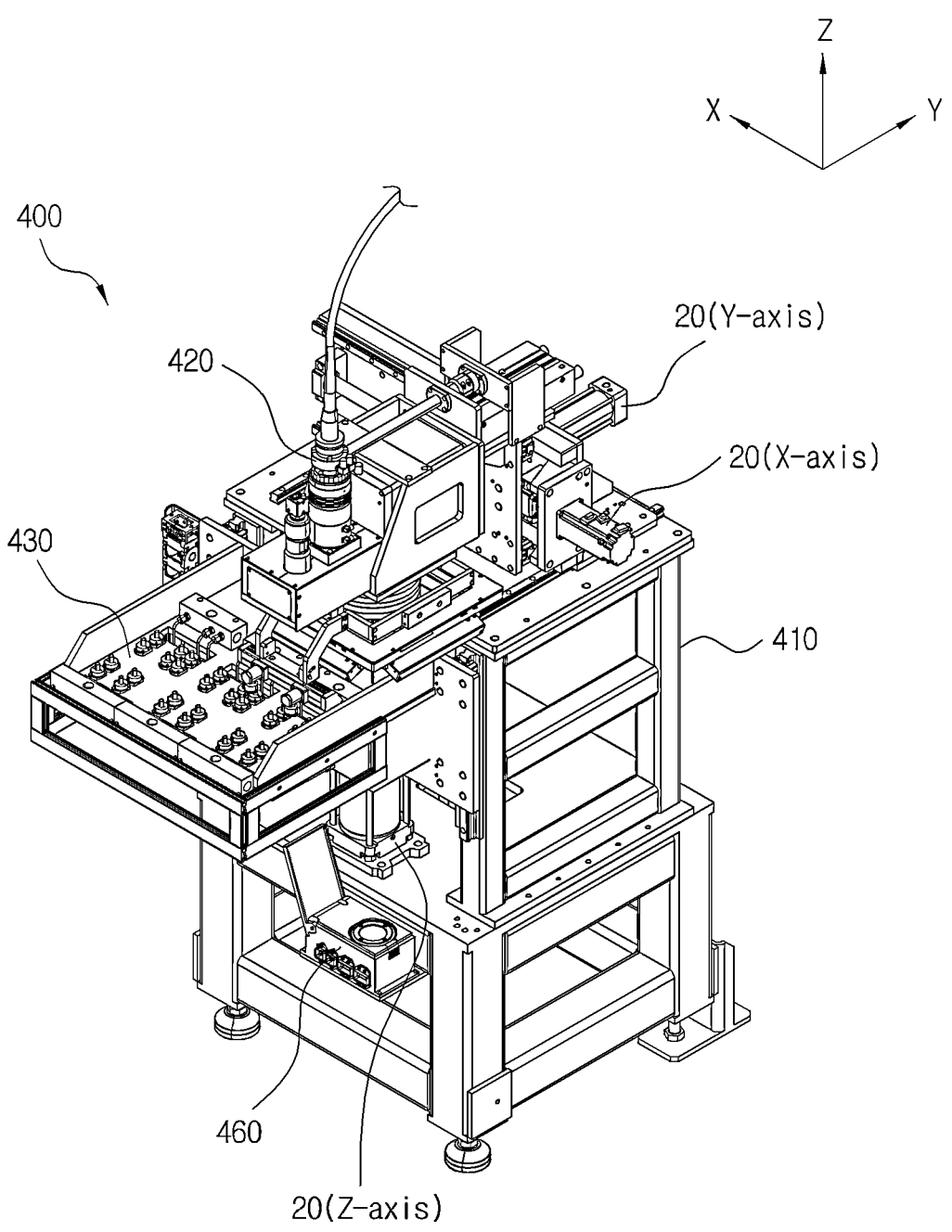
FIG. 12 is a perspective view showing a laser-welding unit of FIG. 1.
Figure 13:
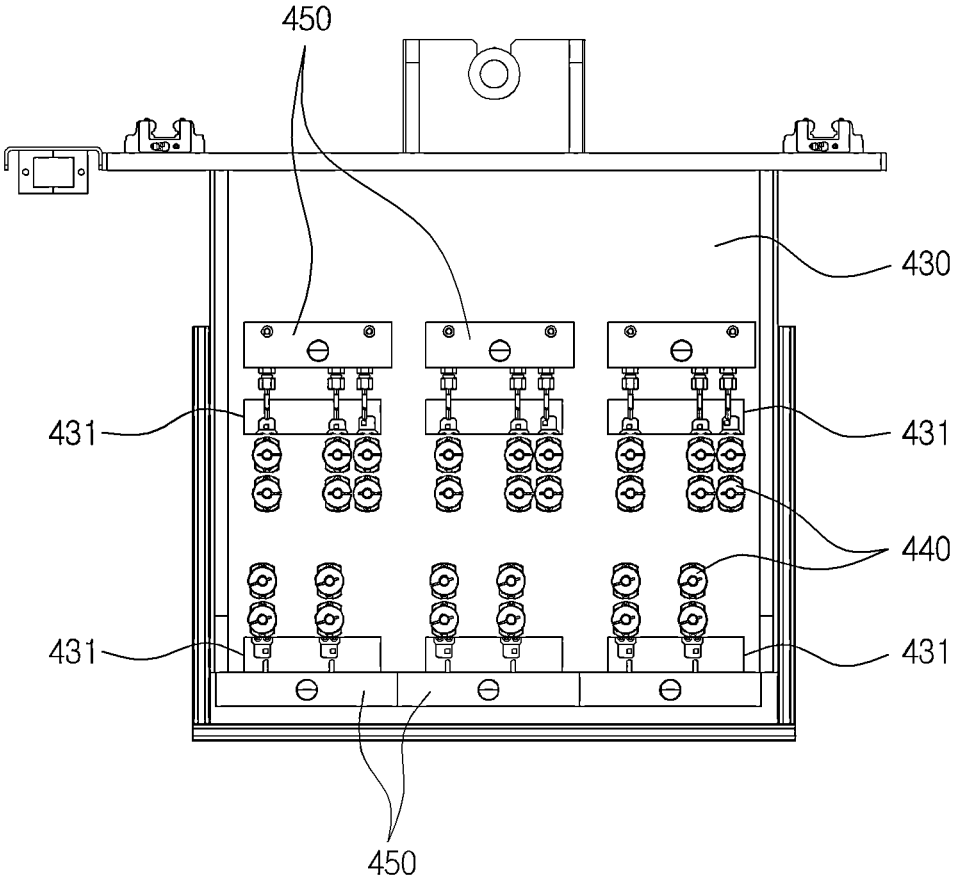
FIG. 13 is an enlarged plan view showing a third lifting plate of FIG. 12.
Figure 14:
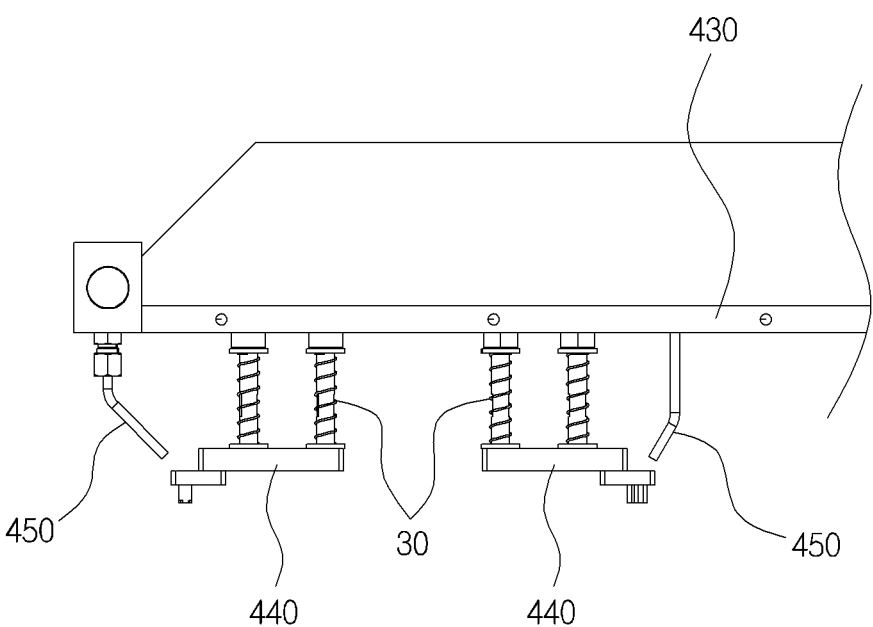
FIG. 14 is an enlarged side view showing the third lifting plate of FIG. 13.
Figure 15:
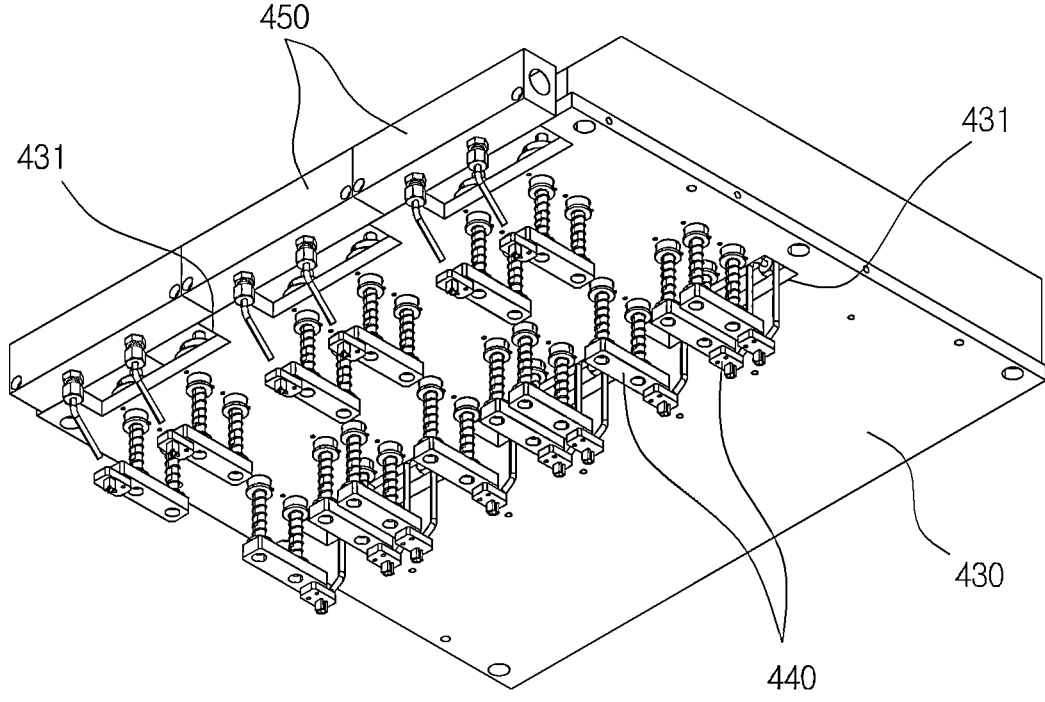
FIG. 15 is an enlarged bottom perspective view showing the third lifting plate of FIG. 13.
Figure 16:
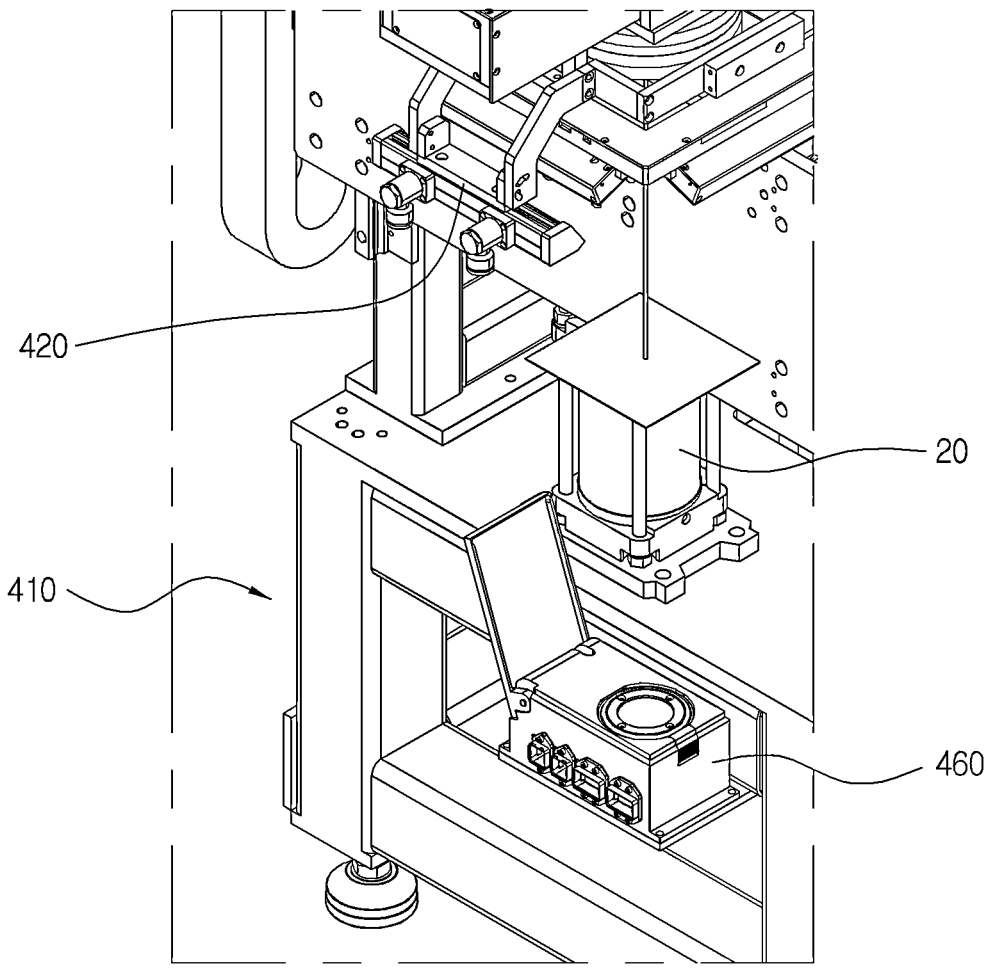
FIG. 16 is an enlarged perspective view showing a measuring device installed on a welding base of FIG. 12.
Figure 17:
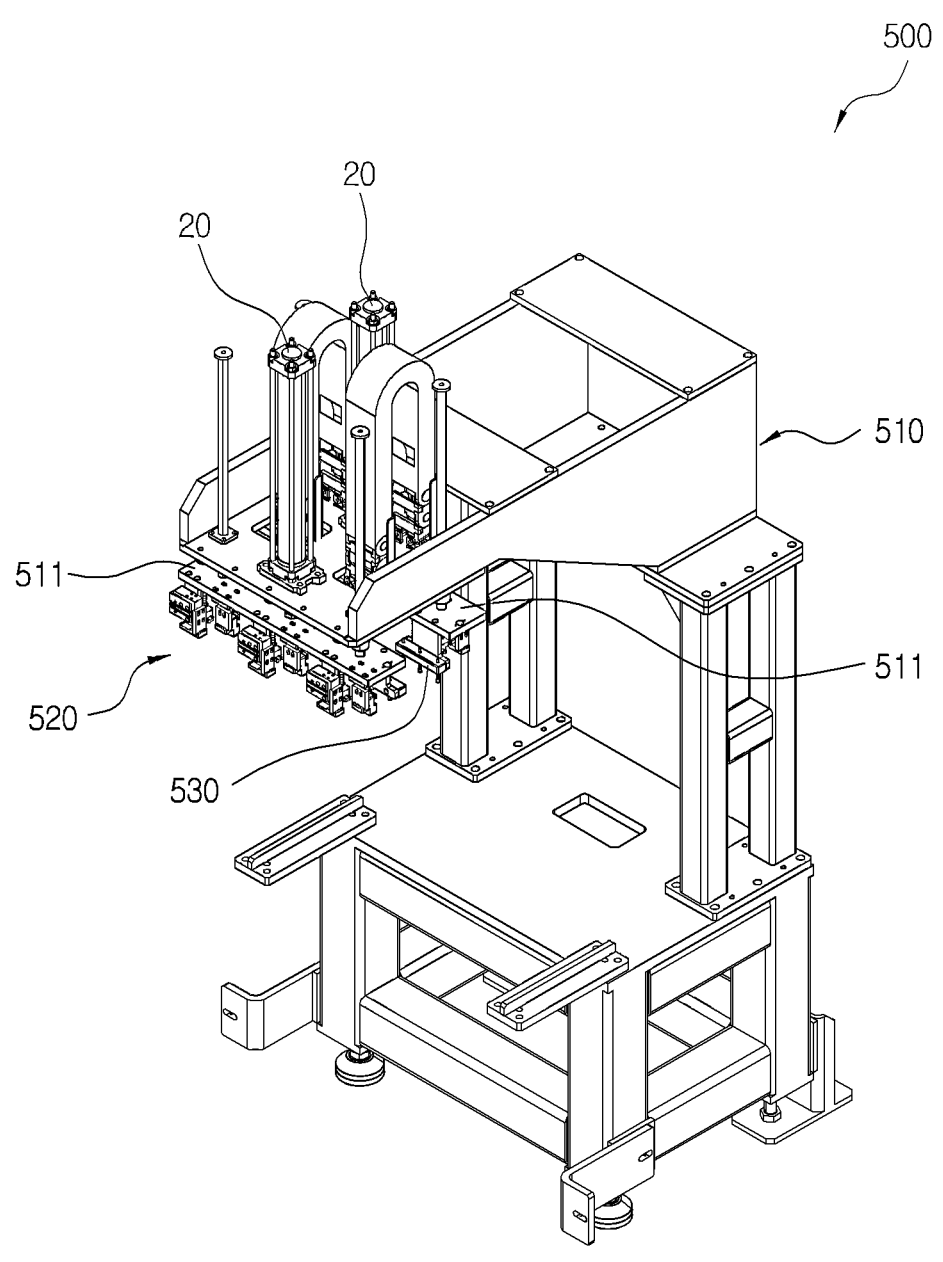
FIG. 17 is a perspective view showing an energization inspection unit of FIG. 1.
Figure 18:
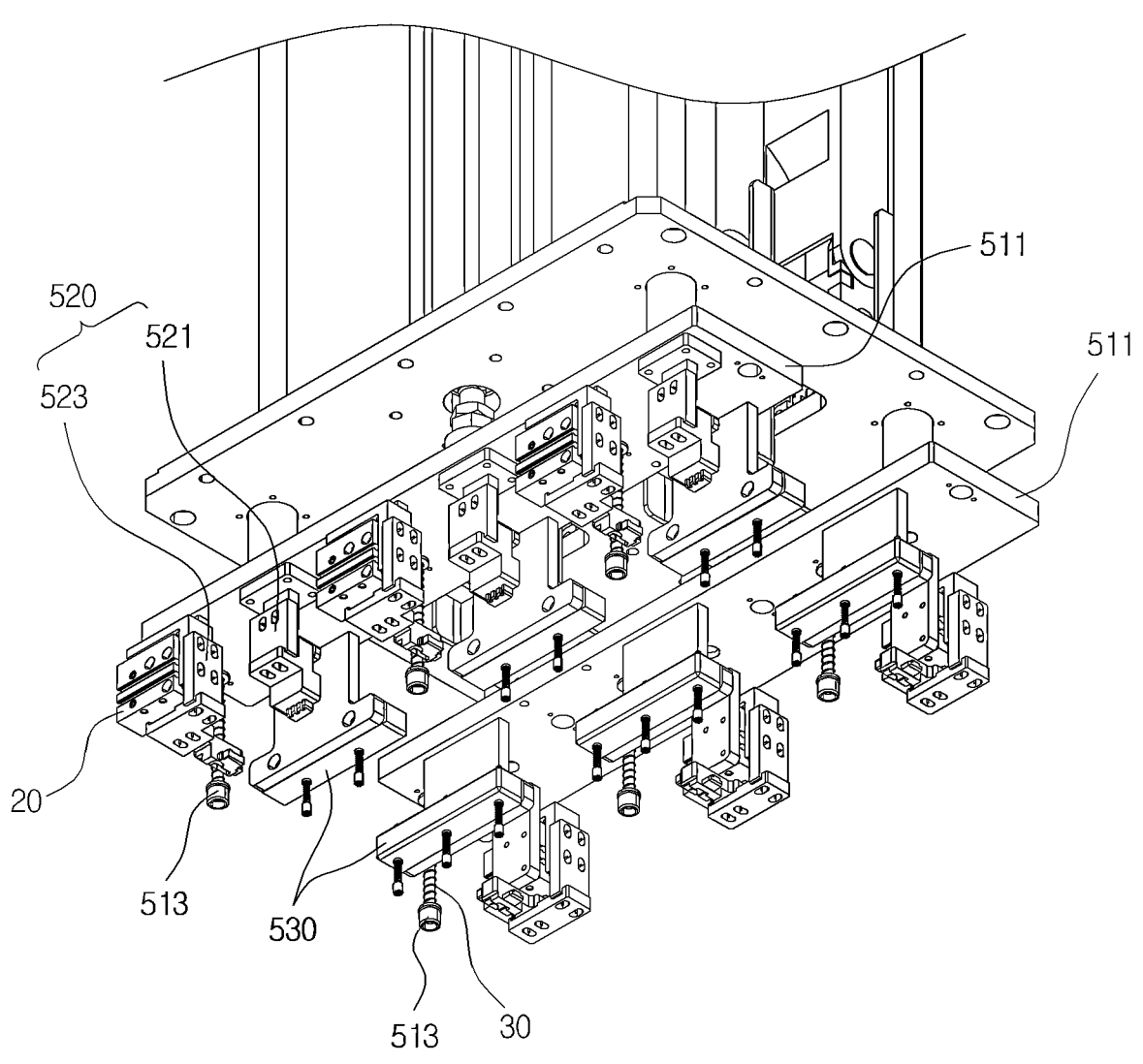
FIG. 18 is a bottom perspective view showing a plurality of terminal coupling members installed on a fourth lifting plate of FIG. 17.
Figure 19:
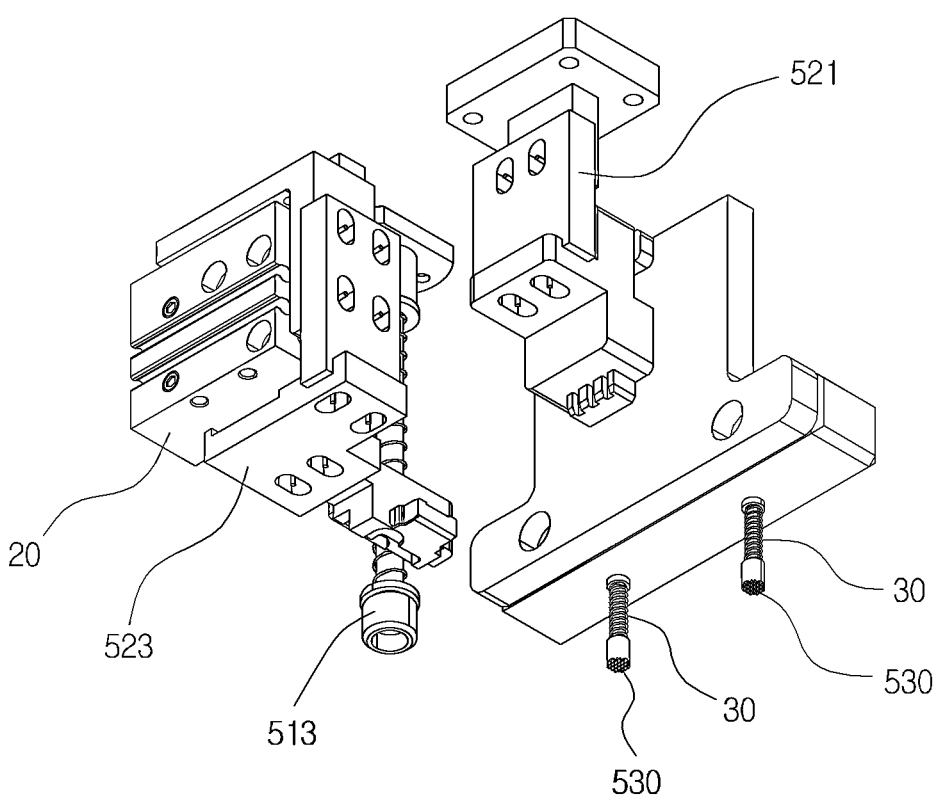
FIG. 19 is an enlarged perspective view showing the terminal coupling member of FIG. 17.
Figure 20:
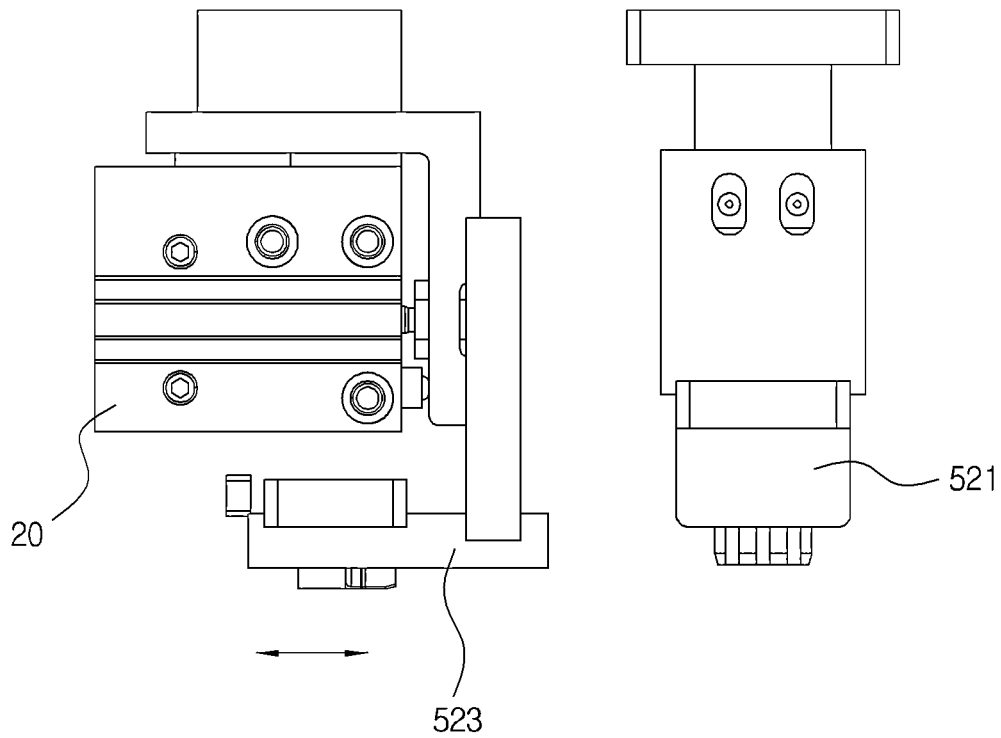
FIG. 20 is a side view showing the terminal coupling member of FIG. 19.

In addition, the heat-fusion unit 300 as shown in FIGS. 9 to 11, includes a fusion base 310, a fusion tip 320, a first cooling pipe 330, and a fall prevention tool 350, which are configured to heat-fuse a PCB board of the sensing block 10 so that the PCB board is electrically connected to the sensing block 10.

For example, similar to the above-described insulation inspection base 210, the fusion base 310 may be formed to have a predetermined height through a fastening tool so that the lower surface may be fixed and supported on the floor by using a plurality of brackets and plates.

The fusion base 310 may be installed at a rear thereof with an air tank 313 to provide air necessary for cooling, and installed with a second lifting plate 311 raised and lowered by a cylinder 20 at a front thereof adjacent to the rotation plate 121.

In addition, a plurality of fusion tips 320 may protrude from a lower part of the second lifting plate 311 to have a pillar shape with a length extending downward to correspond to the number of fronts 11 and nears 13, and may be provided therein with a cartridge (or heating wire) heat-generated by an applied power to fuse the PCB board.

The fusion tip may have a replaceable structure depending on a size of a fusion point P to be fused to the PCB, and settings for fusion temperature and fusion time may be changed through the control unit according to a type of the PCB to be fused.

In addition, as shown in the drawings, the first cooling pipe 330 may have a length downward from a lower part of the second lifting plate 311 so as to be connected to the air tank 313, and discharge air to the fusion point of the PCB by the fusion tip 320 to perform cooling.

The cooling time through the air may be set differently, by the control unit, according to the fusion time or fusion temperature.

In addition, the fall prevention tool 350 is installed on an upper part of the fusion base 310, serves as a safety configuration for preventing the second lifting plate 311 from descending unnecessarily, and includes a first fixing plate 351, a second fixing plate 355, and a fixing cylinder 359.

As shown in the drawings, the first fixing plate 351 may extend downward from an outer surface of the fusion base 310 to have a plate shape, and may be formed on an outer surface thereof with a first opening hole 353 through which a rod extending from the fixing cylinder 359 is inserted.

As shown in the drawings, the second fixing plate 355 may extend upward from an upper surface of the second lifting plate 311 so as to be symmetrical to the first fixing plate 351 without facing each other in the vertical direction, and may be formed on an outer surface thereof with a second opening hole 357 through which the rod of the fixing cylinder 359 passes.

According to the fall prevention tool 350 configured in the above manner, the first opening hole 353 and the second opening hole 357 may be arranged to face each other when the second lifting plate 311 ascends, so that the first fixing plate 351 and the second fixing plate 355 are arranged opposite to each other to allow the rod of the fixing cylinder 359 to pass therethrough, thereby preventing the second lifting plate 311 from descending due to malfunction or the like of the inspection device 1 of the present invention.

Meanwhile, it will be noted that the fall prevention tool 350 in the present invention is shown and described as being provided in the heat-fusion unit 300, however, this is merely one embodiment, and may be applicable to all components lifted and lowered by the cylinder 20.

In addition, as shown in FIGS. 12 to 16, the laser-welding unit 400 is configured to join the terminal 15 constituting the sensing block 10 and the PCB so as to be electrically connected to each other through laser-welding, and includes a welding base 410, a laser welder 420, and a third lifting plate 430.

For example, as shown in the drawings, the welding base 410 may have a lower part fixedly installed on the floor, and may be provided at an upper part thereof with a plurality of cylinders 20 for individually moving the laser welder 420 in the X-axis and Y-axis directions and vertically moving the lifting plate 430 in the Z-axis direction, in which the cylinders may be individually controlled by the control unit.

A servo motor may also be used in addition to the cylinder 20 as a moving means for vertically moving the third lifting plate 430.

To this end, the cylinders 20 for moving the laser welder 420 in the X-axis and Y-axis directions may be installed on the upper part of the welding base 410, so that the third lifting plate 430 may move along rails provided on the welding base 410, and the cylinder 20 for vertically moving the third lifting plate 430 in the Z-axis direction may be installed inside the welding base 410.

As shown in the drawings, welding holes 431 may be perforated in an outer surface of the third lifting plate 430, so that a laser irradiated toward the sensing block 10 through the laser welder 420 passes through the third lifting plate 430 so as to be directly irradiated to the terminal 15, and a plurality of welding holes 431 may be formed in the third lifting plate 430 to correspond to the number of fronts 11 and nears 13 mounted on the jig member 110.

The welding hole 431 may have a long hole shape with a fixed length, so that one laser welder 420 composed of a pair of laser irradiation tips forms welding lines L at once on each outer surface of a plurality of terminals 15 at the front 11 and the near 13.

In addition, a first pressing body 440 may protrude downward to have a length from the lower part of the third lifting plate 430 so as to press and fix a moving sensing block 10, during welding of the sensing block 10, by using the elastic force of the elastic body 30.

Further, a plurality of second cooling pipes 450 may be provided at the lower part of the third lifting plate 430 to discharge air to cool the welded area after welding the terminal 15, and the second cooling pipes 450 may also be supplied with the air through a separate air tank (not shown) provided in the welding base 410, however, may be installed to be supplied with the air by using the air tank 313 provided in the above-described heat-fusion unit 300, if necessary.

In addition, as shown in the drawings, the laser welder 420 may be installed to have a structure movable in the X-axis and Y-axis directions on the welding base 410 by the cylinders 20, and may be formed with the welding lines L welded to have a predetermined interval D formed on the terminal 15 constituting the sensing block 10 through the laser irradiated downward.

The interval D between the welding lines L formed in each terminal 15 may be 3 mm to 4 mm.

Meanwhile, the laser-welding unit 400 in the present invention may further include a measuring device 460 for detecting intensity of the laser, so that lasers having different intensities may be irradiated depending on the type of the sensing block 10.

In addition, as shown in FIGS. 17 to 20, the energization inspection unit 500 is configured to inspect a connection between the PCB and the terminals of the front 11 and the near 13 in which the heat-fusion and the laser-welding have been performed, and includes an energization base 510, a second pressing body 513, a terminal coupling member 520, and a second probe pin 530.

For example, as shown in the drawings, similar to the above-described insulation inspection base 210, the energization base 510 may have a lower surface fixedly installed to the floor such that a plurality of brackets and plates are coupled to each other by fastening.

A pair of cylinders 20 may be provided on an upper part of the energization base 510 so that a pair of fourth lifting plates 511 may be individually raised and lowered under the control of the control unit.

A plurality of second pressing bodies 513 provided with elastic bodies 30, respectively, may be provided at a lower part of each fourth lifting plate 511, so that. the sensing block 10 may be prevented from being moved when an energization inspection is performed on the sensing block using the terminal coupling members 520 and the second probe pins 530 described later.

The terminal coupling members 520 are configured to be inserted into the terminal pins formed on the front 11 and the near 13 to perform the energization inspection of the second probe pin 530 and the sensing block 10, and each includes a plurality of first insertion terminals 521 and second insertion terminals 523.

As shown in the drawings, the first insertion terminal 521 is configured to be inserted into a terminal pin having an opening in the vertical direction, and the second insertion terminal 523 is configured to be inserted into a terminal pin opened in the horizontal direction and is provided at the lower part of the fourth lifting plate 511.

Because the second insertion terminal 523, unlike the first insertion terminal 521 inserted into the terminal pin only by lowering the fourth lifting plate 511, has a state in which the terminal pin is open in the horizontal direction, it is preferable that the second insertion terminal may be moved horizontally through extending and contracting of the rod of the cylinder 20 controlled by the control unit after the fourth lifting plate 511 is completely lowered, so that the second insertion terminal 523 may be inserted into the terminal pin opened in the horizontal direction.

In addition, as shown in the drawings, a plurality of second probe pins 530 may be provided on the lower part of the fourth lifting plate 511 to correspond to the number of fronts 11 and nears 13, and come into contact with the laser-welded terminal 15 when the fourth lifting plate 511 descends, so that a voltage necessary for the energization inspection may be applied.

The second probe pin 530, like the above-described first probe pin 230, may be provided on an outer surface thereof with an elastic body 30 to come into contact with the sensing block 10 through an elastic force.

Figure 21:
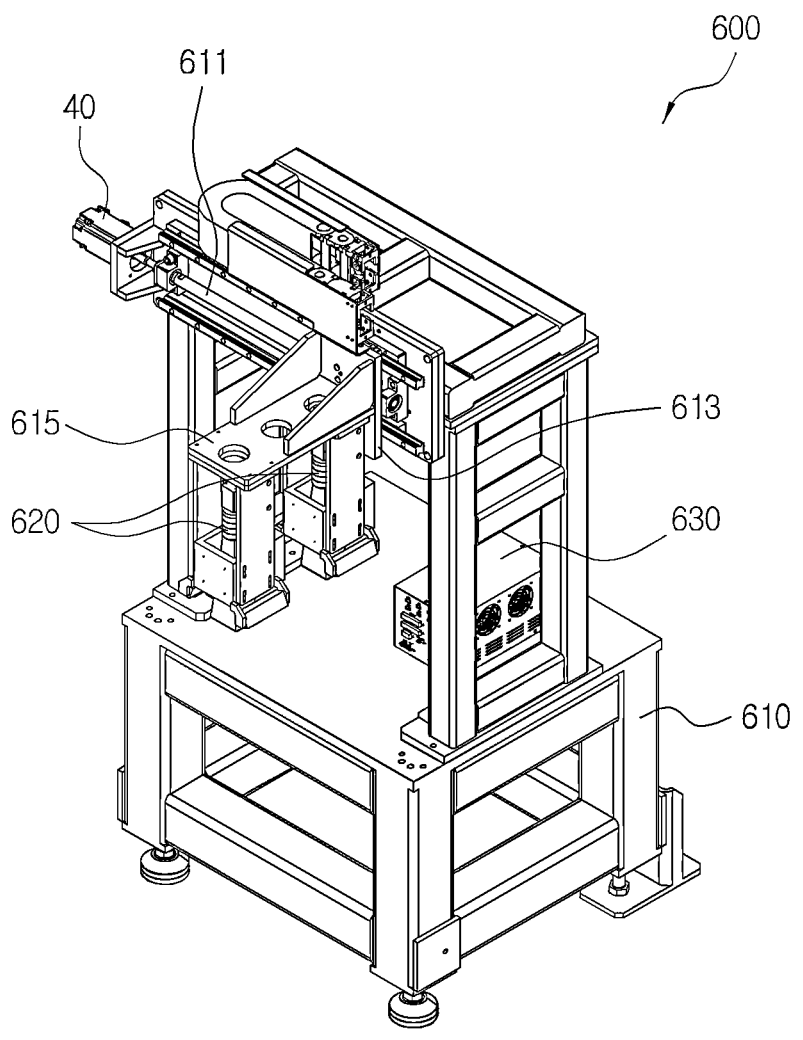
FIG. 21 is a perspective view showing a vision inspection unit of FIG. 1.
Figure 22:
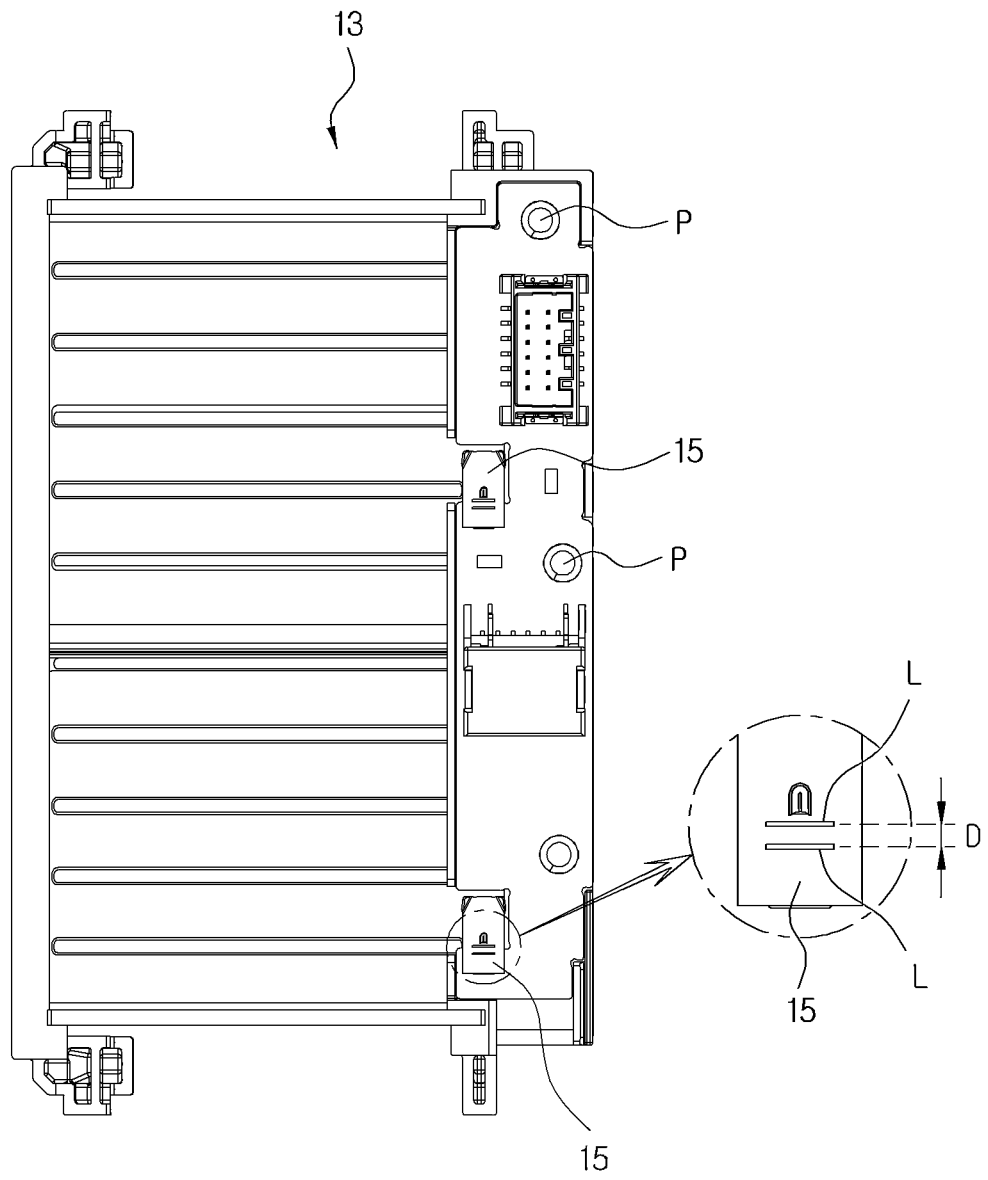
FIG. 22 is a plan view showing a near to be inspected using the sensing block inspection device thermally fused and laser-welded to be mounted on a battery module according to the present invention.

In addition, as shown in FIGS. 21 and 22, the vision inspection unit 600 is configured to magnify and photograph the PCB of the sensing block 10 after execution of the energization inspection to confirm the fusion point and the appearance of the terminal 15 having the welding lines L through an image, and includes a vision base 610 and a vision camera 620.

For example, the vision base 610, similar to the above-described insulation inspection base 210, may be formed to have a predetermined height and have a lower surface fixedly supported by the floor such that by a plurality of brackets and plates are coupled by fastening means.

A screw 611 rotated by a motor may be formed on an upper part of the vision base 610, and a moving plate 613 screw-coupled may be installed to an outer surface of the screw 611 to enable the vision camera 620 to reciprocate in the X-axis direction.

To this end, a moving bracket 615 may be mounted on an outer surface of the moving plate 613, and a pair of vision cameras 620 may be installed to a lower part of the moving bracket 615.

One of the pair of vision cameras 620 may photograph the fronts 11 mounted on the jig member 110 to obtain image information, and, the other may photograph the nears 13 mounted on the jig member 110 to obtain image information.

In addition, the obtained image information may be transmitted to the control unit through the transceiver unit 630 provided in the vision base 610, thereby allowing the administrator to monitor based on the image information.

Figure 23:
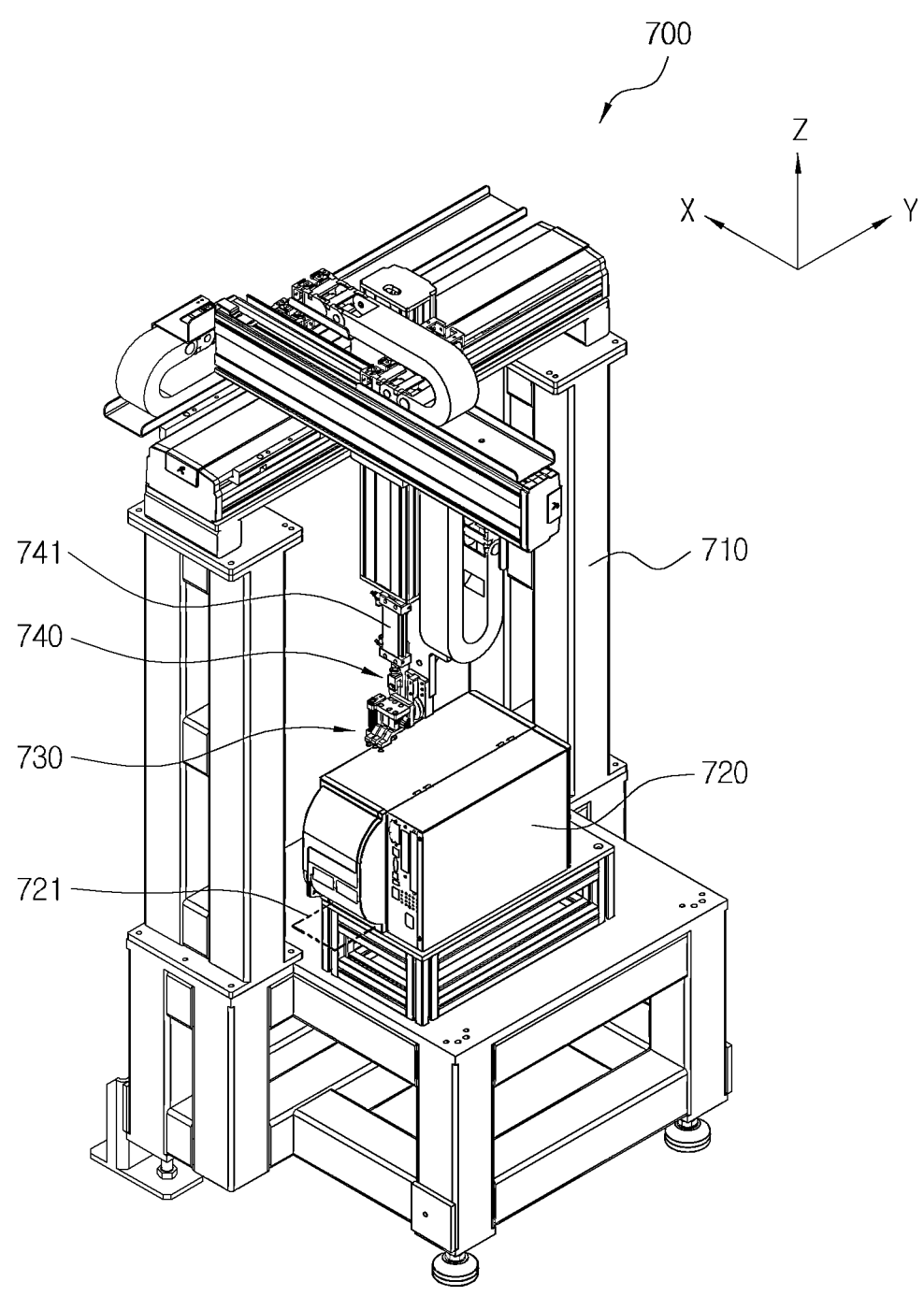
FIG. 23 is a perspective view showing a barcode adhesive unit of FIG. 1.
Figure 24:
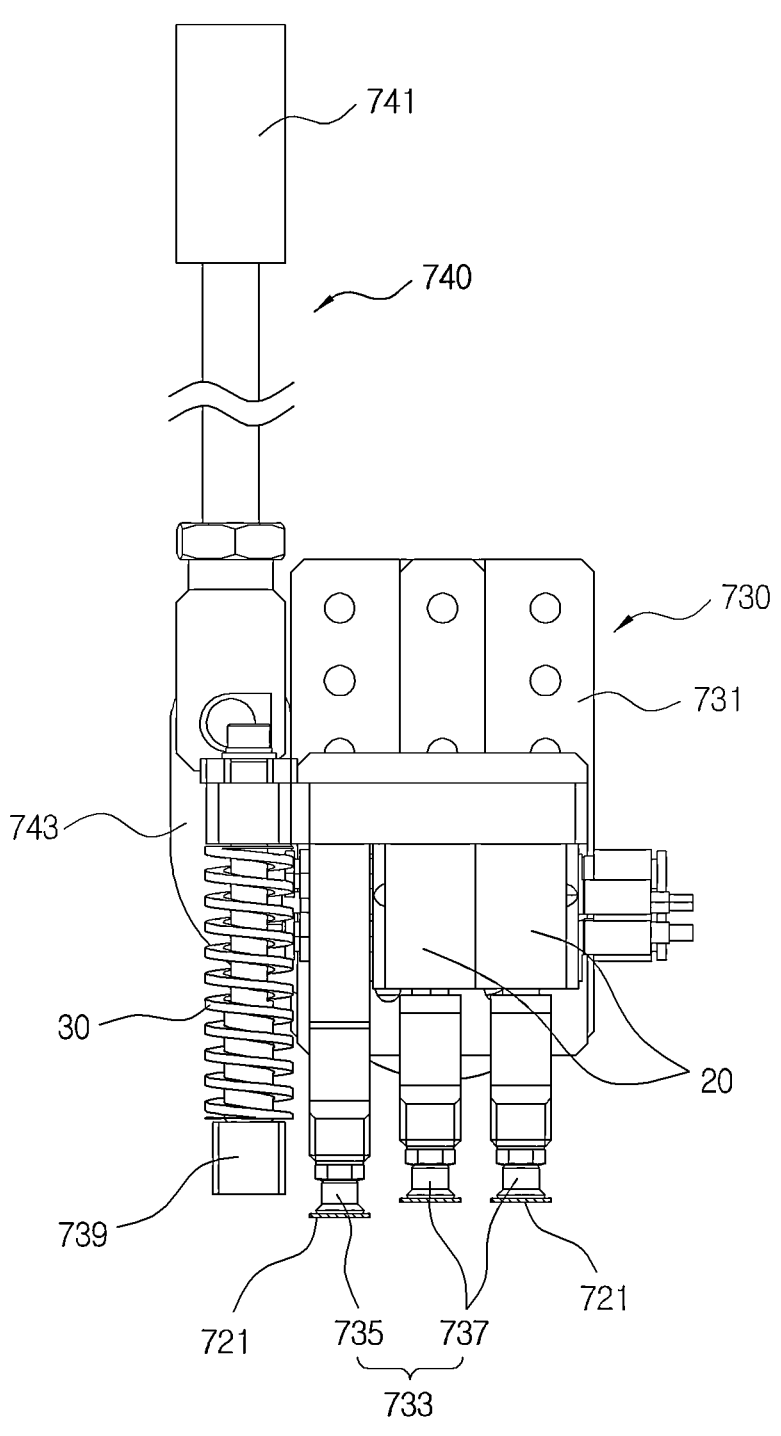
FIG. 24 is an enlarged front view showing an adhesive member and a rotation member of FIG. 23.
Figure 25:
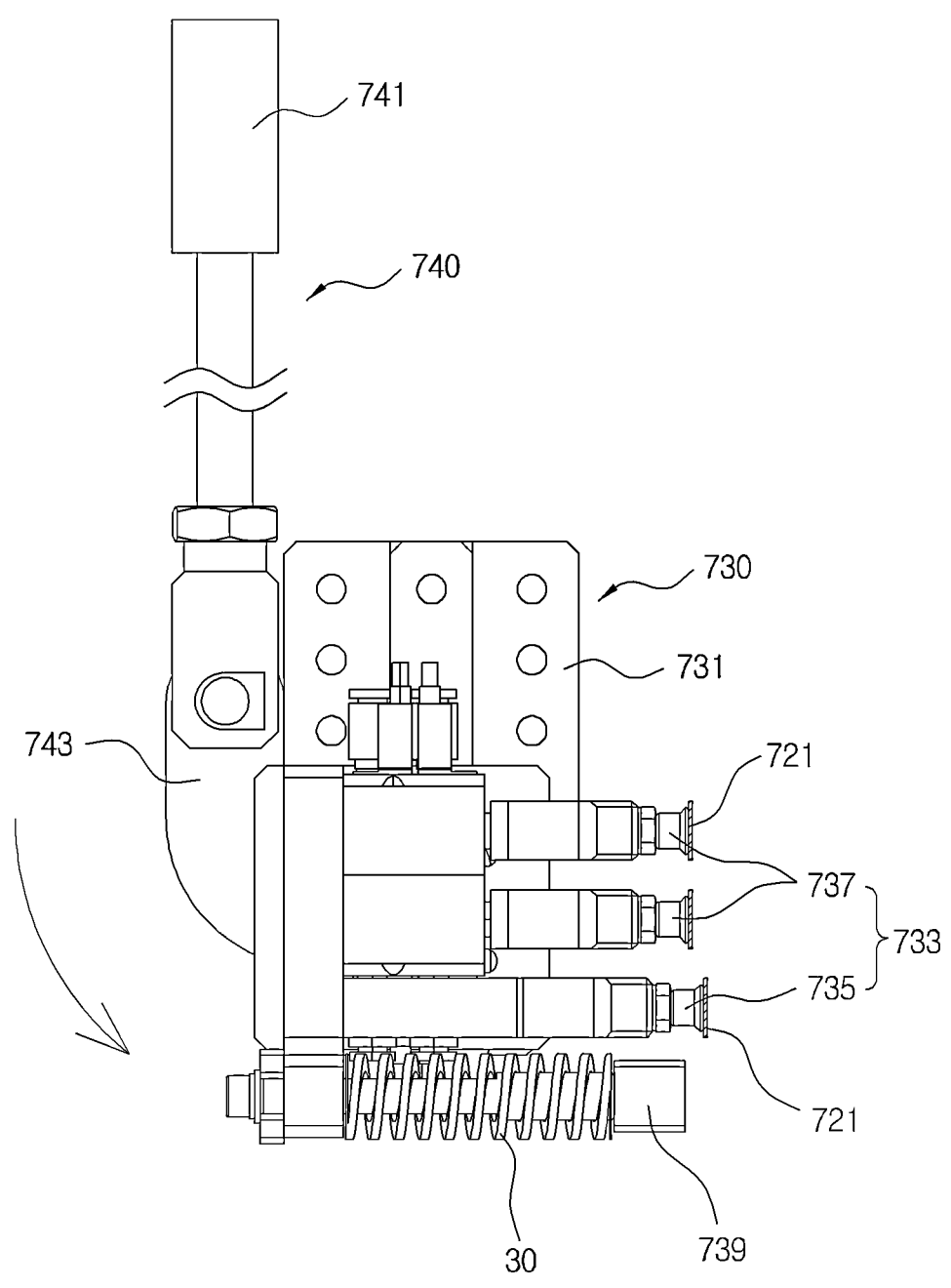
FIG. 25 is a view showing the adhesive member rotated by the rotation member of FIG. 24.
Figure 26:
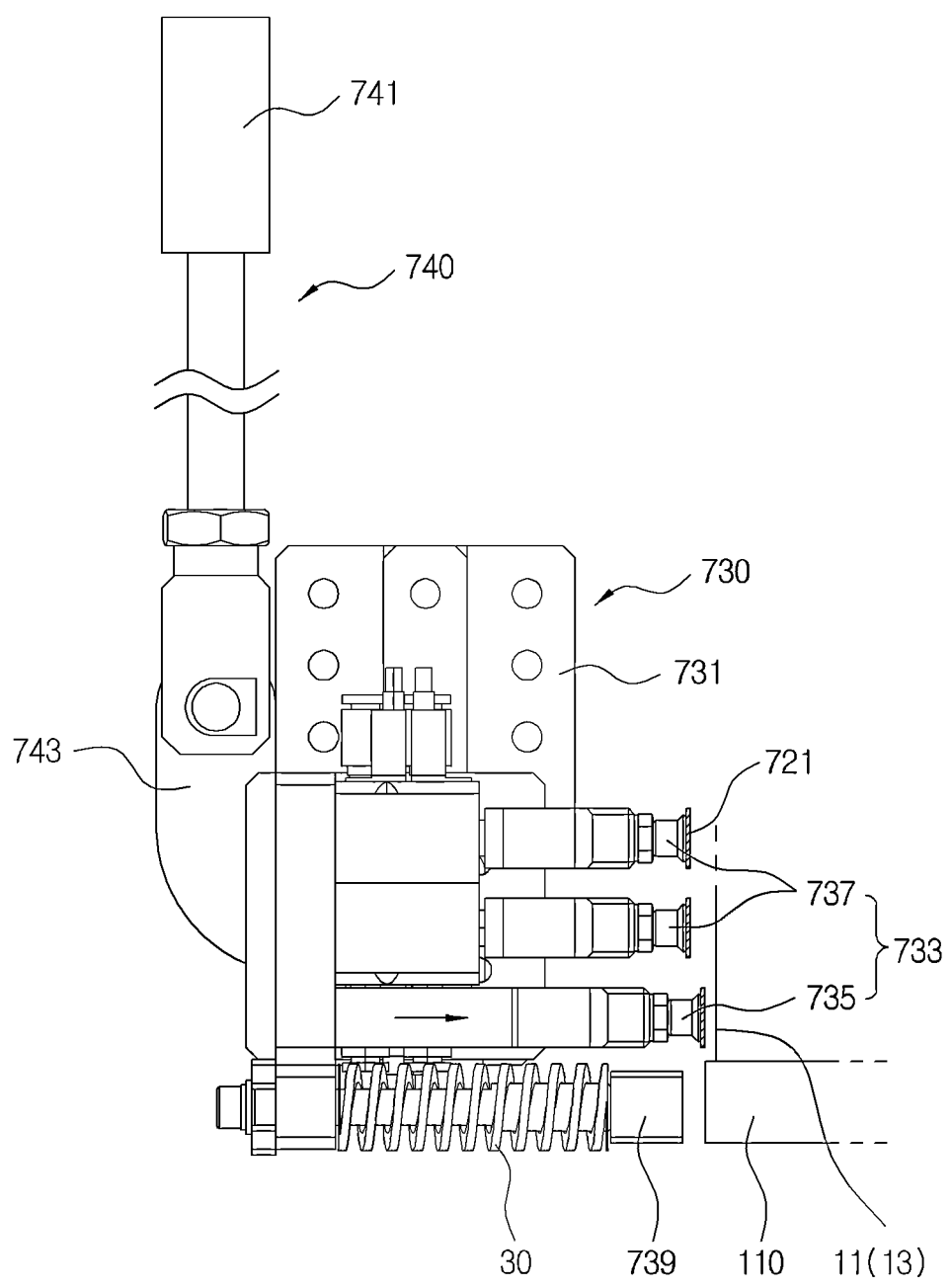
FIGS. 26 to 29 are views showing the functional relationship of the adhesive member of FIG. 24.
Figure 27:
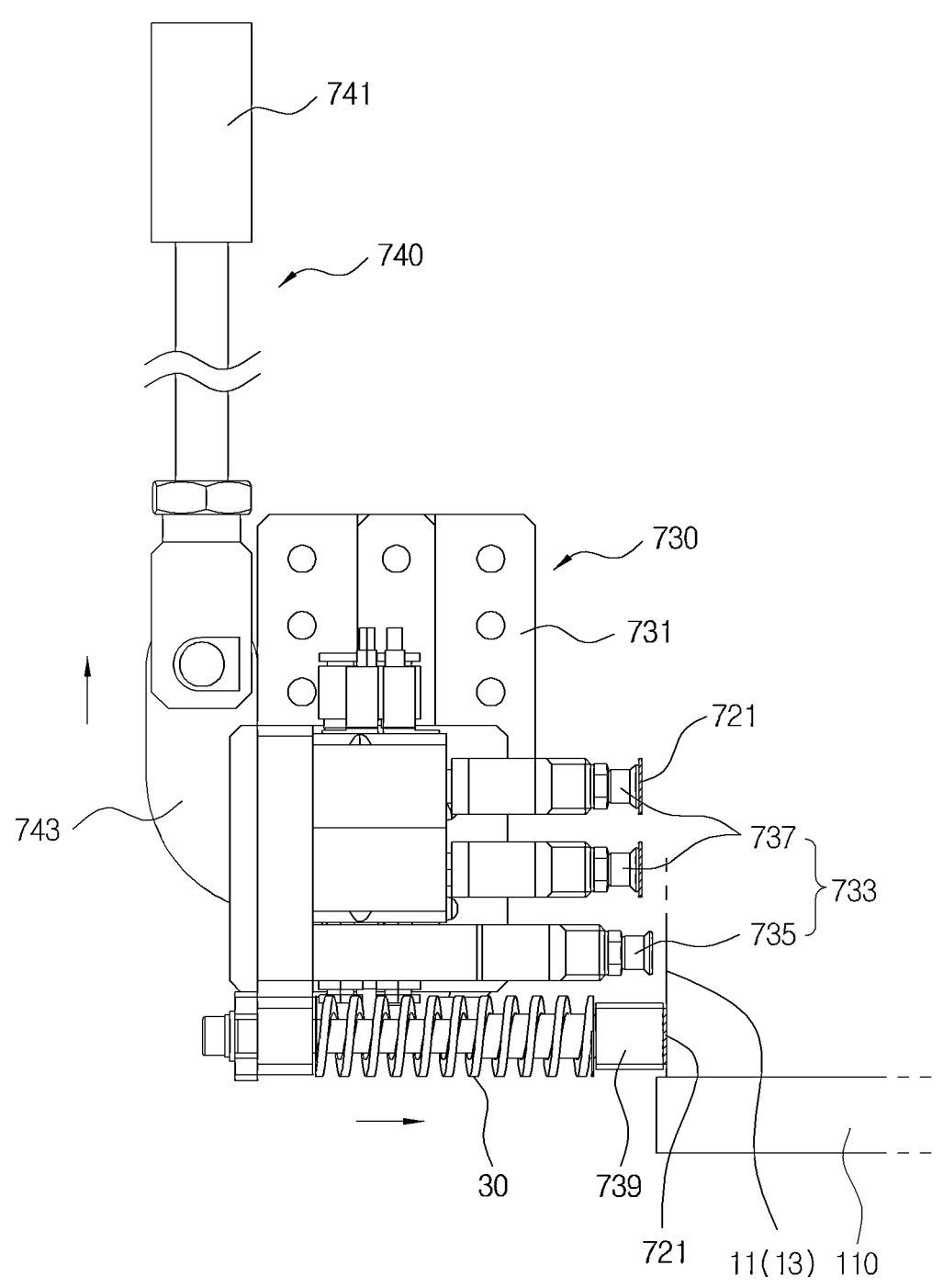
Figure 28:
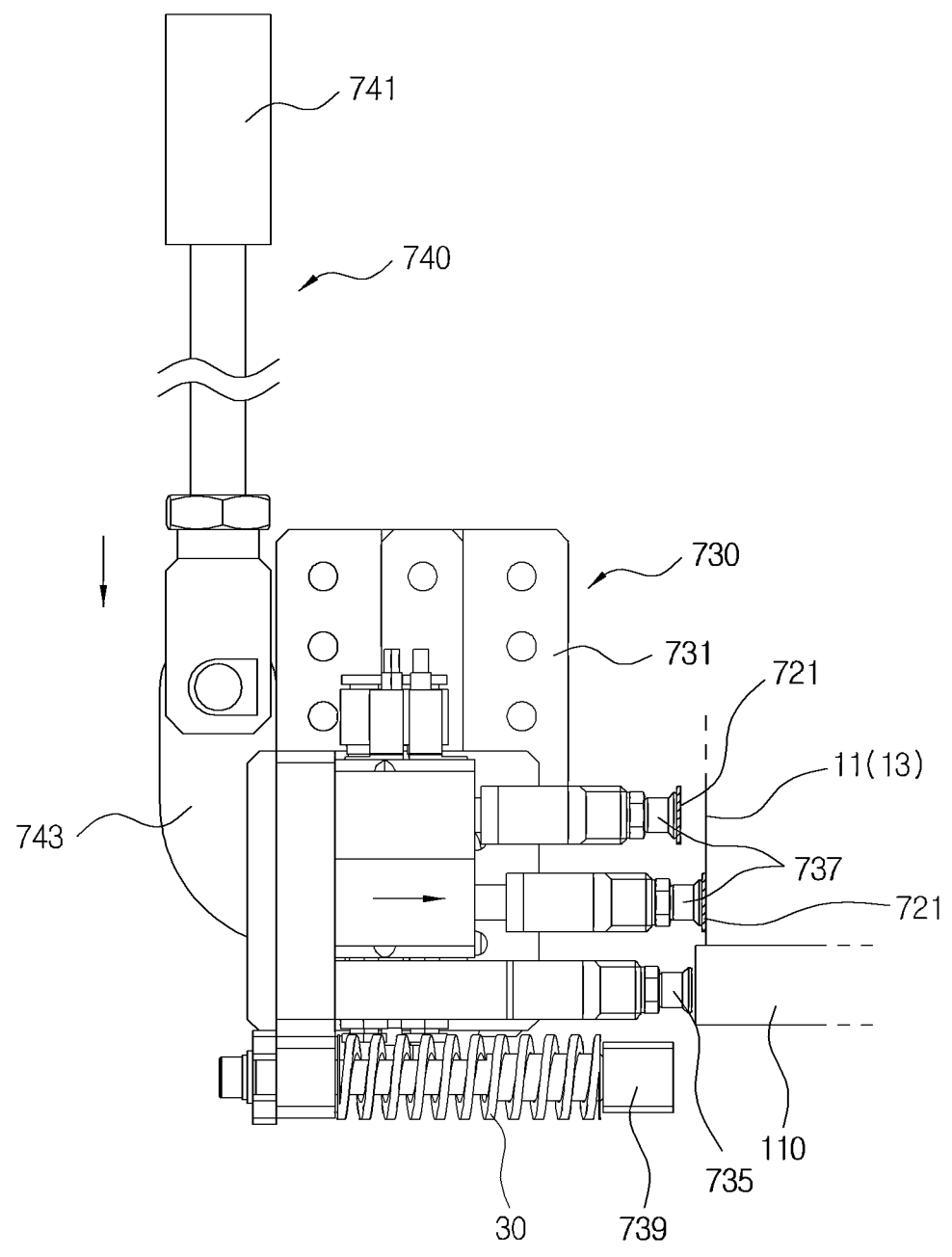
Figure 29:
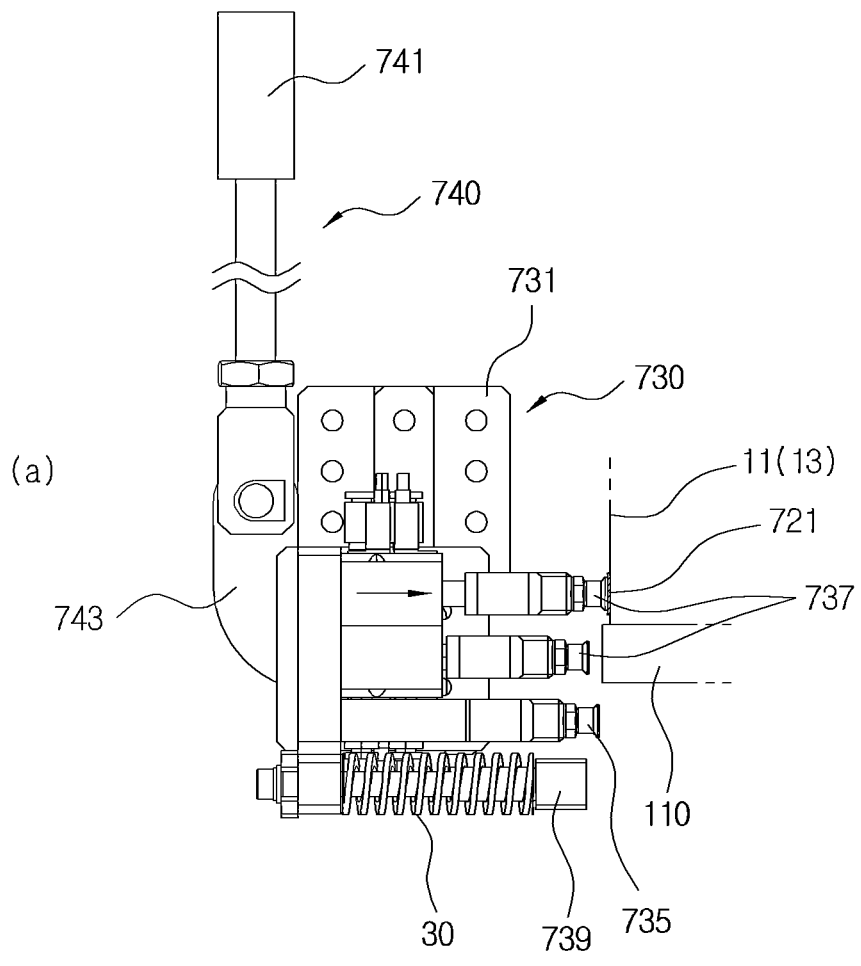
Figure 29:
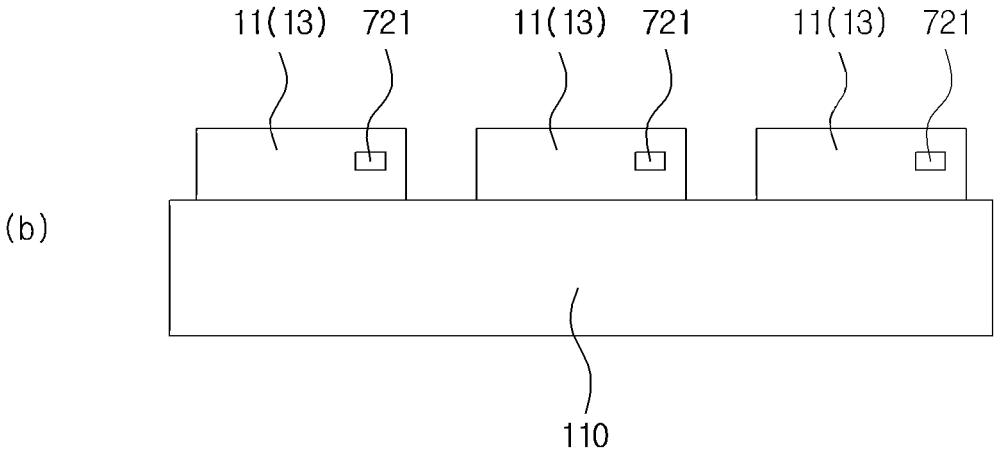

In addition, as shown in FIGS. 23 to 25, the barcode adhesive unit 700 is configured to allow a barcode containing unique information (for example, model name or applicable battery module) of the corresponding sensing block 10 to adhere to a surface of the sensing block 10 completed in the inspection, heat-fusion and laser-welding through the above-described components, and includes a barcode base 710, an adhesive member 730, and a rotation member 740.

Prior to the description, as shown in the inspection device 1 of the present invention, a pair of barcode adhesive units 700 having the same configuration may be arranged adjacent to each other at one rotation plate 121, and controlled by the control unit such that one adheres barcode printing papers 721 to outer surfaces of the fronts 11 mounted on the jig member 110, and the other sequentially adheres other barcode printing papers 721 to surfaces of the nears 13 mounted on the jig member 110.

For example, as shown in the drawings, similar to the above-described insulation resistance inspection unit 200, the barcode base 710 may be fixedly installed on the floor by coupling a plurality of brackets and plates with fastening means to have a predetermined height from the floor.

Barcode printers 720 may be installed inside the barcode base 710 to output barcode printing papers 721 for adhering to the surfaces of the fronts 11 and the nears 13 by the adhesive member 730 described later.

The barcode printer 720 may print and output a barcode on the surface of the barcode printing paper 721 inside the barcode printer 720 under the control of the control unit, and a perforation line may be formed for easy separation.

Meanwhile, an upper part of the barcode base 710 according to the present invention has a structure for reciprocating the adhesive member 730 in the X-axis and Y-axis directions by using a plurality of cylinders (not shown).

In addition, the adhesive member 730 is configured to individually adsorb the barcode printing papers 721 printed through the barcode printer 720 so as to be cut along the perforation line by air adsorption to adhere to the surfaces of the fronts 11 and the nears 13, and includes an adsorption bar 733 and a third pressing body 739.

As shown in the drawings, the adsorption bars 733 may be provided on the adhesive bracket 731 to correspond to the number of fronts 11 or nears 13 mounted on the jig member 110. Three adsorption bars in total including one first adsorption bar 735 and a pair of second adsorption bars 737 and mounted on the adhesive bracket 731 will be described as an example in the present invention.

In addition to the adsorption bars 733, a pressing body 739 may be provided on an outer surface of the adhesive bracket 731 to press the barcode printing paper 721 adhering to the surface of the sensing block 10 through an elastic force of the elastic body 30, thereby improving adhesion.

In addition, the adhesive bracket 731 may be rotatably coupled to the rotation member 740 to rectangularly rotate the adsorption bars 733 and the pressing body 739 according to ascending and descending of a rod of the lifting cylinder 741 constituting the rotation member 740.

Accordingly, the barcode printing paper 721 output from the barcode printer 720 may be easily adsorbed and the rotation member 740 may be rotated such that the barcode printing paper 721 may adhere to the surface of the sensing block 10.

Further, in the present invention, the pair of second adsorption bars 737, unlike the first adsorption bar 735, may have a structure moved by cylinders 20, and an end of the first adsorption bar 735 for adsorbing the barcode printing paper 721 may have a structure protruding more than ends of the second adsorption bars 737.

Accordingly, as shown in FIGS. 26 to 29, in the process of the barcode printing papers 721 adhering to the outer surfaces of a total of three fronts 11 or nears 13, the printing paper adsorbed on the first adsorption bar 735 may be adhered by priority and then the adhesive bracket 731 may be lifted so that the third pressing body 739 presses the adhered printing paper.

Thereafter, while the barcode printing paper 721 is adsorbed by the pressure of the third pressing member 739, the control unit may allow the printing paper adsorbed on one of the pair of second adsorption bars 733 to move and adhere to a surface of another sensing block 10, and the control unit may drive the adhesive member 730 so that the third pressing body 739 presses again the printing papers adhered by the second adsorption bars 233. In the above manner, the total of three barcode printing papers 721 can stably adhere to the outer surfaces of the three fronts 11 or nears 13 mounted on the jig member 110.

In addition, as shown in the drawings, the rotation member 740 is configured to change the direction of the barcode printing papers 721 discharged from the barcode printer 720 and adsorbed by the adhesive member 730 (that is, rotate the adsorption unit to face the surface of the sensing block), and includes a lifting cylinder 741 and a link 743.

Th this end, the lifting cylinder 741 may be fixedly installed on the outer surface of the barcode base 710, and the rod of the lifting cylinder 741 may be connected to one side of a link 743.

The other side of the link 743 may be rotatably coupled to the adhesive bracket 731, so that the adhesive bracket 731 may be rectangularly rotated in forward (clockwise) and reverse directions according to expanding and contracting of the rod of the lifting cylinder 741.

In other words, the link 743 may function to receive a linear motion of the lifting cylinder 741 and change the direction of motion so that the adhesive bracket 731 may be rotated.

As described above, in the inspection device 1 according to the present invention unlike the related art, a plurality of sensing blocks 10 mounted on the jig member 110 can be rotated by rotation of the rotation plate 121 step by step, and the insulation resistance, heat-fusion, laser-welding, energization inspection, vision inspection, and barcode adhesion can be quickly performed for the corresponding sensing blocks 10 according to the rotation direction around the rotation plate 121 even in a narrow space, so that time for the inspection can be shortened and mass production of the sensing blocks 10 can be facilitated.

The present invention has been described with reference to the limited embodiments, drawings and particular items such as specific components, but it will be understood that the above description has been merely provided for further understanding the present invention, the embodiments do not limit the present invention, and various changes and modifications may be made by those skilled in the art. Therefore, the idea of the present invention will not be determined by the aforementioned embodiments only, and the following claims as well as all modifications or variations belonging to the equivalents of the claims will be within the scope of the invention.

What is claimed is:

1. A sensing block inspection device thermally fused and laser-welded to be mounted on a battery module in an inspection device for inspecting a sensing block mounted on an electric vehicle battery module through a control signal from a control unit, the sensing block inspection device comprising:

a turntable for rotating a jig member mounted thereon with the sensing block including a front and a near;

an insulation resistance inspection unit for performing an insulation resistance inspection on the sensing block mounted on the jig member;

a heat-fusion unit for heat-fusing the sensing block mounted on the jig member;

a laser-welding unit for laser-welding the sensing block mounted on the jig member;

an energization inspection unit for performing an energization inspection on the sensing block mounted on the jig member;

a vision inspection unit for transmitting image information, which is obtained by photographing the sensing block mounted on the jig member and heat-fused by the heat-fusing unit and the sensing block mounted on the jig member and welded by the laser-welding unit, to a control unit; and a barcode adhesive unit for allowing a barcode printing paper to adhere to the sensing block mounted on the jig member, wherein the control unit controls the turntable to allow the jig member to sequentially move to the insulation resistance inspection unit, the heat-fusion unit, the laser-welding unit, the energization inspection unit, the vision inspection unit, and the barcode adhesive unit.

2. The sensing block inspection device of claim 1, wherein the turntable includes:

a rotation base provided at an upper central part thereof with a rotation motor; and a disc-shaped rotation plate rotatably coupled to the rotation motor and having a top surface on which at least one jig member is mounted, wherein the insulation resistance inspection unit, the heat-fusion unit, the laser-welding unit, the energization inspection unit, the vision inspection unit and the barcode adhesive unit are sequentially arranged around the rotation plate.

3. The sensing block inspection device of claim 2, wherein the jig member includes:

an installation plate detachably coupled to the rotation plate; and a plurality of protrusions protruding from an upper part of the installation plate and individually mounted thereon with the fronts and the nears, wherein the protrusion includes:

an insertion pin inserted into a groove formed on a lower surface of the front or the near, and through-holes through which a plurality of detection pins raised and lowered to detect a presence or absence of the front and the near inserted into the protrusions, in which the through-holes are perforated to be connected to the installation plate.

4. The sensing block inspection device of claim 1, wherein the insulation resistance inspection unit includes:

an insulation inspection base installed to have a predetermined height and provided at a lower part thereof with a first lifting plate raised and lowered by a cylinder;

a sensing member installed at a lower part of the first lifting plate and upwardly protruding over the first lifting plate upon contact with the sensing block (10) to perform an electrical short-circuit; and a first probe pin mounted at a lower part of the first lifting plate to come into contacts with the sensing block through an elastic force to inspect an insulation resistance of the sensing block, wherein the first probe pin is controlled to apply an electric signal to the sensing block only when the sensing block is present through the sensing member, and the sensing member and the first probe pin are installed on the first lifting plate to correspond to a number of the fronts and the nears.

5. The sensing block inspection device of claim 4, wherein the sensing member 220 includes:

a contact terminal provided at an upper part of the first lifting plate so as to be electrically connected to the control unit; and an elastic terminal inserted through the first lifting plate and raised to be electrically connected to the contact terminal through an elastic force after contact with the sensing block when the first lifting plate is lowered.

6. The sensing block inspection device of claim 1, wherein the heat-fusion unit includes:

a fusion base having a predetermined height and provided with a cylinder and an air tank for raising and lowering the second lifting plate;

a plurality of fusion tips mounted on a lower part of the second lifting plate and generating heat by an applied power source to fuse PCBs provided in the front and the near;

a first cooling pipe mounted on the lower part of the second lifting plate so as to be pipe-connected to the air tank to discharge air to cool the fused PCBs; and a stripper mounted on the lower part of the second lifting plate to press and fix the fused and cooled sensing block through an elastic force.

7. The sensing block inspection device of claim 1, further comprising:

a fall prevention tool including:

a first fixing plate formed therein with a first opening hole;

a second fixing plate formed therein with a second opening hole; and a fixing cylinder having a rod inserted through the first opening hole and the second opening hole disposed to face each other.

8. The sensing block inspection device of claim 1, wherein the laser-welding unit includes:

a welding base having a predetermined height and provided with cylinders having rods extending and contracting in X-axis, Y-axis, and Z-axis directions, respectively;

a laser welder installed on the welding base so as to be connected to at least two of the cylinders and movable in the X-axis and Y-axis directions;

a third lifting plate positioned below the laser welder and connected to a cylinder having the rod expanding and contracting in the X-axis direction so as to be mounted to the welding base and vertically movable, in which the third lifting plate is formed therein with a plurality of welding holes through which a laser for welding passes;

a plurality of first pressing bodies installed on a lower part of the third lifting plate to press and fix terminals formed on the front and the near through an elastic force; and a second cooling pipe for discharging air to cool the welded terminals.

9. The sensing block inspection device of claim 8, wherein the laser-welding unit further includes:

a measuring device installed on the welding base to measure intensity of the laser radiated from the laser welder.

10. The sensing block inspection device of claim 1, wherein the energization inspection unit includes:

an energization base provided with a pair of cylinders having a predetermined height, and installed therein with a pair of fourth lifting plates coupled to the cylinders, respectively, to be raised and lowered;

a second probe pin installed on a lower surface of the fourth lifting plate to elastically come into contact with the sensing block, thereby applying an electric signal;

a terminal coupling member installed on the lower surface of the fourth lifting plate and electrically connected to a first terminal pin and a second terminal pin formed on the sensing block; and a second pressing body installed on the lower surface of the fourth lifting plate to press and fix the sensing block, wherein the terminal coupling member includes a first insertion terminal inserted into the first terminal pin having an open top, and a second insertion terminal inserted into the second terminal pin having an open side.

11. The sensing block inspection device of claim 10, wherein the second insertion terminal is configured to reciprocate in a horizontal direction by the cylinder so as to be inserted into or separated from the second terminal pin having the open side.

12. The sensing block inspection device of claim 1, wherein the vision inspection unit includes:

a vision base equipped with a motor for rotating a screw and installed therein with a moving plate screw-coupled by the screw to move in the X-axis direction along a rail;

a pair of vision cameras mounted on a lower part of a moving bracket installed on the moving plate; and a transceiver unit installed on the vision base to transmit image information obtained by the vision cameras to the control unit.

13. The sensing block inspection device of claim 12, wherein the vision cameras photograph a portion fused to a PCB board and a plurality of welding lines (L) welded to the terminal, in which the welding lines (L) are formed on a terminal to have an interval of 3 mm to 4 mm.

14. The sensing block inspection device of claim 1, wherein a pair of barcode adhesive units are installed on the turntable, in which one of the barcode adhesive units allows a barcode printing paper to adhere to an outer surface of the front, and an opposite one of the barcode adhesive units is controlled to allow the barcode printing paper to adhere to a surface of the near.

15. The sensing block inspection device of claim 1, wherein the barcode adhesive unit includes:

a barcode base installed therein with a plurality of cylinders having rods expanding and contracting in the X-axis, Y-axis, and Z-axis directions;

a barcode printer installed on the barcode base to discharge tearable barcode printing papers on which a barcode is printed;

an adhesive member for adsorbing the discharged barcode printing paper and adhering the adsorbed barcode printing paper to the sensing block; and a rotation member installed on the barcode base to rotate the adhesive member.

16. The sensing block inspection device of claim 15, wherein the adhesive member includes:

an adhesive bracket rotatably coupled to the rotation member;

a plurality of adsorption bars provided on the adhesive bracket to adsorb the discharged barcode printing papers, respectively; and a third pressing body provided on the adhesive bracket to press the barcode printing paper by an elastic force after the adsorption bar adheres the barcode printing paper to the sensing block.

17. The sensing block inspection device of claim 15, wherein the rotation member includes:

a lifting cylinder; and a link having one side rotatably coupled to the lifting cylinder and an opposite side coupled to the adhesive bracket to shift a vertical movement of the lifting cylinder to a rotational movement for rotating the adhesive bracket.

18. The sensing block inspection device of claim 16, wherein the adsorption bar includes:

a first adsorption bar provided on the adhesive bracket to have a fixed length; and a pair of adsorption bars installed on the adhesive bracket, adjacent to the first adsorption bar and having variable lengths through the cylinders.

\*    \*    \*    \*    \*